（12）United States Patent
Matsumoto

(10) Patent No.: US 10,460,908 B2
(45) Date of Patent: Oct. 29, 2019

(54) MULTI CHARGED PARTICLE BEAM WRITING APPARATUS AND MULTI CHARGED PARTICLE BEAM WRITING METHOD

(71) Applicant: NuFlare Technology, Inc., Yokohama-shi (JP)

(72) Inventor: Hiroshi Matsumoto, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 16/051,911

(22) Filed: Aug. 1, 2018

(65) Prior Publication Data

US 2019/0066975 A1 Feb. 28, 2019

(30) Foreign Application Priority Data

Aug. 2, 2017 (JP) .................................. 2017-149854

(51) Int. Cl.
*H01J 37/317* (2006.01)
*H01J 37/302* (2006.01)
*H01J 37/304* (2006.01)
*H01J 37/24* (2006.01)

(52) U.S. Cl.
CPC ............ *H01J 37/304* (2013.01); *H01J 37/24* (2013.01); *H01J 37/3177* (2013.01); *H01J 2237/0455* (2013.01); *H01J 2237/30461* (2013.01); *H01J 2237/30472* (2013.01); *H01J 2237/31776* (2013.01)

(58) Field of Classification Search
CPC ...... H01J 37/24; H01J 37/304; H01J 37/3177; H01J 2237/0455; H01J 2237/30461; H01J 2237/30472; H01J 2237/31776
See application file for complete search history.

(56) References Cited

U.S. PATENT DOCUMENTS

| | | | | |
|---|---|---|---|---|
| 5,834,783 A | * | 11/1998 | Muraki | ................. B82Y 10/00 250/398 |
| 9,601,315 B2 | | 3/2017 | Kawana et al. | |
| 2015/0248993 A1 | * | 9/2015 | Reiter | ................... H01J 37/045 250/492.22 |
| 2016/0276131 A1 | * | 9/2016 | Platzgummer | ...... H01J 37/3177 |

FOREIGN PATENT DOCUMENTS

JP 2016-103557 6/2016

* cited by examiner

*Primary Examiner* — Eliza W Osenbaugh-Stewart
(74) *Attorney, Agent, or Firm* — Oblon, McClelland, Maier & Neustadt, L.L.P.

(57) ABSTRACT

A multiple charged particle beam writing apparatus includes a circuitry to calculate, for each of the plurality of combinations, a first distribution coefficient for each of the three beams configuring the combination concerned, for distributing a dose to irradiate the design grid concerned to the three beams such that the gravity center position of each distributed dose coincides with the position of the design grid concerned and the sum of the each distributed dose coincides with the dose to irradiate the design grid concerned; and a circuitry to calculate, for each of the four or more beams, a second distribution coefficient of each of the four or more beams relating to the design grid concerned by dividing the total value of at least one first distribution coefficient corresponding to the beam concerned in the four or more beams by the number of the plurality of combinations.

10 Claims, 25 Drawing Sheets

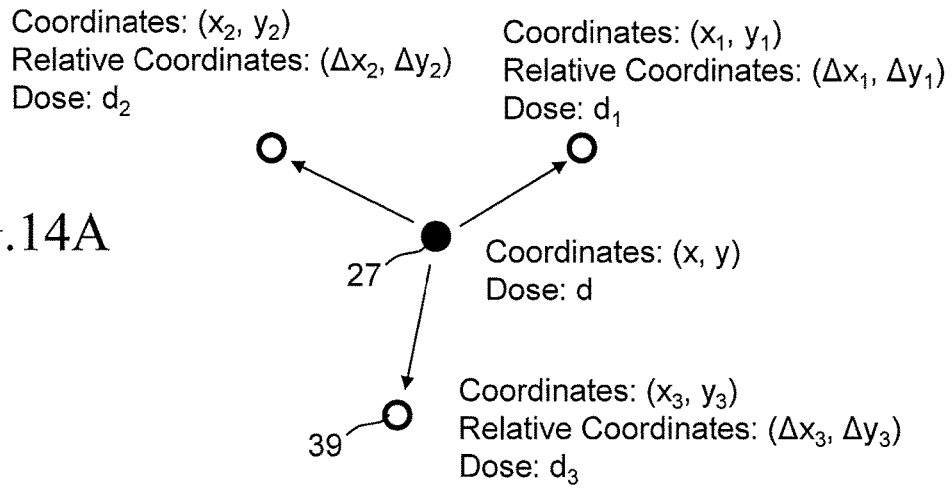

FIG.14A

FIG.14B $\begin{pmatrix} x \\ y \\ d \end{pmatrix} = \begin{pmatrix} x_1 & x_2 & x_3 \\ y_1 & y_2 & y_3 \\ 1 & 1 & 1 \end{pmatrix} \begin{pmatrix} d_1 \\ d_2 \\ d_3 \end{pmatrix}$ → Gravity center coincidence
→ Store dose FIG.14C $\begin{pmatrix} d_1 \\ d_2 \\ d_3 \end{pmatrix} = \begin{pmatrix} \Delta x_1 & \Delta x_2 & \Delta x_3 \\ \Delta y_1 & \Delta y_2 & \Delta y_3 \\ 1 & 1 & 1 \end{pmatrix}^{-1} \begin{pmatrix} 0 \\ 0 \\ d \end{pmatrix}$ Relative coordinate representation whose origin is target grid FIG.14D $d_k = w_k{}' d$

| Distribution Destination Beam | $i_1, j_1$ | $i_2, j_2$ | ... | $i_4, j_4$ |
|---|---|---|---|---|
| Distribution Coefficient $w_k$ | $w_1'$ | $w_2'$ | ... | $w_4'$ |

MULTI CHARGED PARTICLE BEAM WRITING APPARATUS AND MULTI CHARGED PARTICLE BEAM WRITING METHOD

CROSS-REFERENCE TO RELATED APPLICATION

This application is based upon and claims the benefit of priority from prior Japanese Patent Application No. 2017-149854 filed on Aug. 2, 2017 in Japan, the entire contents of which are incorporated herein by reference.

BACKGROUND OF THE INVENTION

Field of the Invention

Embodiments of the present invention relate to a multi charged particle beam writing apparatus and a multi charged particle beam writing method, and, for example, relate to a method for controlling the maximum irradiation time of multi-beam writing.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits becomes progressively narrower year by year. The electron beam writing technique, which intrinsically has excellent resolution, is used for writing or "drawing" a mask pattern on a mask blank with electron beams.

For example, as a known example of employing the electron beam writing technique, there is a writing apparatus using multiple beams. Since it is possible for multi-beam writing to irradiate multiple beams at a time, the writing throughput can be greatly increased in comparison with single electron beam writing. For example, a writing apparatus employing the multi-beam system forms multiple beams by letting portions of an electron beam emitted from an electron gun individually pass through a corresponding one of a plurality of holes in a mask, performs blanking control for each beam, reduces each unblocked beam by an optical system in order to reduce a mask image, and deflects the beam by a deflector to irradiate a desired position on a target object or "sample".

In multi-beam writing, the dose of each beam is controlled based on the irradiation time. However, since irradiation of multiple beams is carried out at the same time, the shot time per shot is rate-controlled based on the maximum irradiation time of each beam. Thus, when moving the stage continuously at a constant speed, the stage speed is defined by the speed which enables to perform irradiation of the maximum irradiation time in all the shots of multiple beams. Accordingly, the shot of the maximum irradiation time restricts the shot cycle and the stage speed. If the maximum irradiation time increases, the throughput of the writing apparatus decreases correspondingly to the increased time.

For the dose of each beam, dose modulation is performed in order to correct dimension variations occurred due to a phenomenon such as a proximity effect. In multiple beams, distortion occurs in an exposure field due to optical system characteristics, and therefore, the irradiation position of each beam deviates from the ideal grid because of the distortion. However, in multiple beams, it is difficult to deflect each beam individually, thereby being difficult to individually control the position of each beam on the target object surface. Accordingly, there is disclosed that positional deviation of each beam is corrected by dose modulation (e.g., refer to Japanese Patent Application Laid-open No. 2016-103557). The level of a dose to irradiate each irradiation position in the case of performing dose modulation needs to be, for example, several hundred percent of that of the base dose. Therefore, the maximum irradiation time becomes further increased.

BRIEF SUMMARY OF THE INVENTION

According to one aspect of the present invention, a multiple charged particle beam writing apparatus includes an emission source configured to emit a charged particle beam;

a shaping aperture array substrate configured to form multiple charged particle beams by being irradiated with the charged particle beam;

a combination setting circuitry configured to set, for each of a plurality of design grids being irradiation positions in design of the multiple charged particle beams, a plurality of combinations each composed of three beams whose actual irradiation positions surround a design grid concerned in the plurality of design grids, by using four or more beams whose actual irradiation positions are close to the design grid concerned;

a first distribution coefficient calculation circuitry configured to calculate, for each of the plurality of combinations, a first distribution coefficient for each of the three beams configuring a combination concerned in the plurality of combinations, for distributing a dose to irradiate the design grid concerned to the three beams configuring the combination concerned such that a position of a gravity center of each distributed dose coincides with a position of the design grid concerned and a sum of the each distributed dose coincides with the dose to irradiate the design grid concerned, where at least one the first distribution coefficient is calculated for the each of the four or more beams;

a second distribution coefficient calculation circuitry configured to calculate, for each of the four or more beams, a second distribution coefficient of the each of the four or more beams relating to the design grid concerned by dividing a total value of the at least one the first distribution coefficient corresponding to a beam concerned in the four or more beams by a number of the plurality of combinations; and a writing mechanism configured to write a pattern on a target object with the multiple charged particle beams in which the dose to irradiate each of the plurality of design grids has been distributed to each corresponding one of the four or more beams.

According to another aspect of the present invention, a multiple charged particle beam writing method includes setting, for each of a plurality of design grids being irradiation positions in design of multiple charged particle beams, a plurality of combinations each composed of three beams whose actual irradiation positions surround a design grid concerned in the plurality of design grids, by using four or more beams whose actual irradiation positions are close to the design grid concerned;

calculating, for each of the plurality of combinations, a first distribution coefficient for each of the three beams configuring a combination concerned in the plurality of combinations, for distributing a dose to irradiate the design grid concerned to the three beams configuring the combination concerned such that a position of a gravity center of each distributed dose coincides with a position of the design grid concerned and a sum of the each distributed dose coincides with the dose to irradiate the design grid concerned, where at least one the first distribution coefficient is calculated for the each of the four or more beams;

calculating, for each of the four or more beams, a second distribution coefficient of the each of the four or more beams relating to the design grid concerned by dividing a total value of the at least one the first distribution coefficient corresponding to a beam concerned in the four or more beams by a number of the plurality of combinations; and writing a pattern on a target object with the multiple charged particle beams in which the dose to irradiate each of the plurality of design grids has been distributed to each corresponding one of the four or more beams.

BRIEF DESCRIPTION OF THE DRAWINGS

FIGS. 14A to 14D illustrate a method for distributing a dose to surrounding three proximity beams according to the first embodiment;

DETAILED DESCRIPTION OF THE INVENTION

Embodiments below describe an apparatus and method which can shorten the maximum irradiation time in multi-beam writing.

Embodiments below describe a configuration in which an electron beam is used as an example of a charged particle beam. The charged particle beam is not limited to the electron beam, and other charged particle beam such as an ion beam may also be used.

First Embodiment

Figure 1:
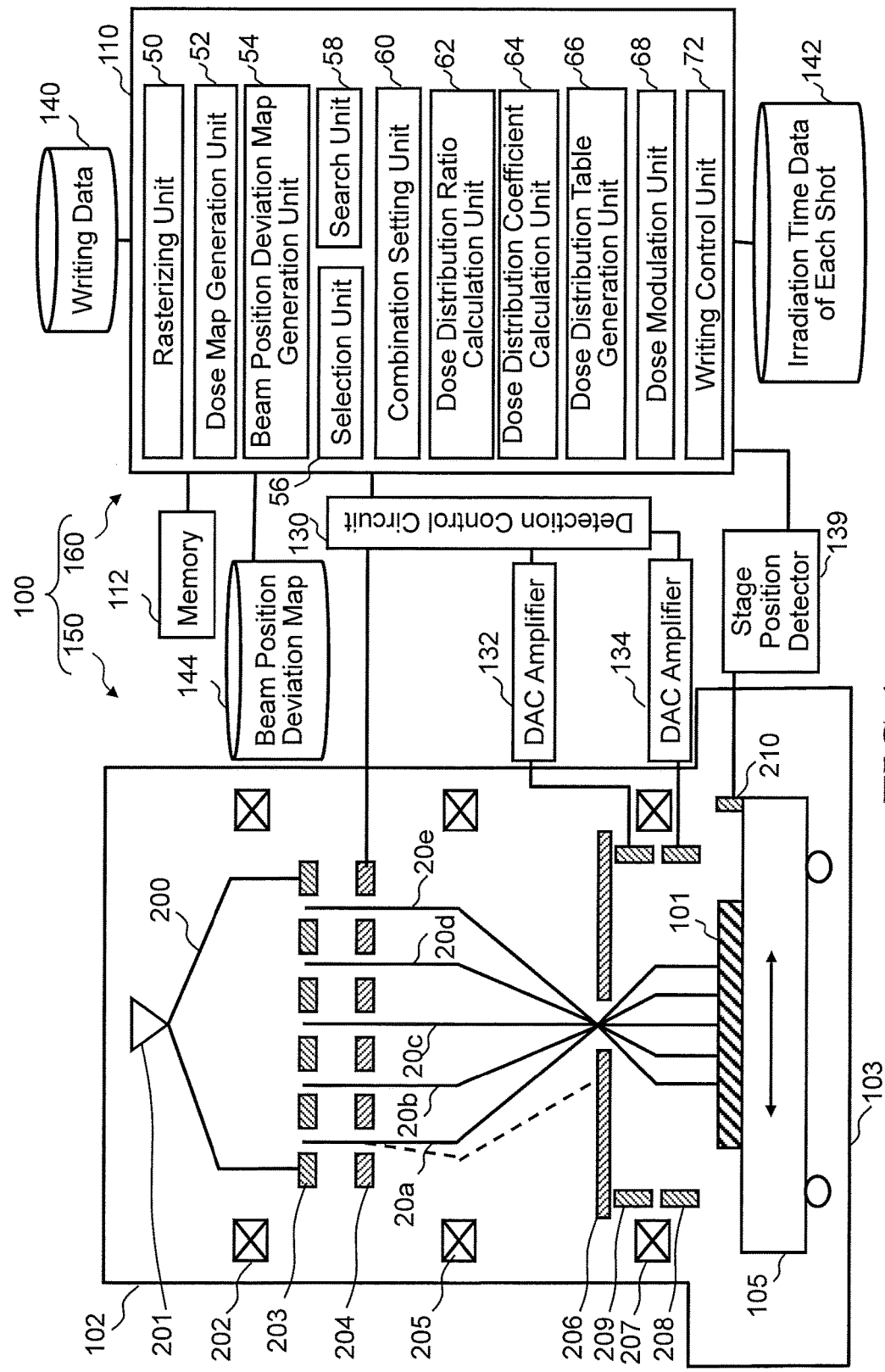
FIG. 1 is a schematic diagram showing a configuration of a writing apparatus according to a first embodiment.

FIG. 1 is a schematic diagram showing a configuration of a writing or "drawing" apparatus according to a first embodiment. As shown in FIG. 1, a writing apparatus 100 includes a writing mechanism 150 and a control system circuit 160. The writing apparatus 100 is an example of a multi charged particle beam writing apparatus. The writing mechanism 150 includes an electron optical column 102 (multi electron beam column) and a writing chamber 103. In the electron optical column 102, there are arranged an electron gun 201, an illumination lens 202, a shaping aperture array substrate 203, a blanking aperture array mechanism 204, a reducing lens 205, a limiting aperture substrate 206, an objective lens 207, a deflector 208, and a deflector 209. In the writing chamber 103, there is arranged an XY stage 105. On the XY stage 105, a target object or "sample" 101 such as a mask blank, on which resist is applied, serving as a writing target substrate is placed when writing is performed. The target object 101 is, for example, an exposure mask used for fabricating semiconductor devices, or a semiconductor substrate (silicon wafer) for fabricating semiconductor devices. Moreover, a mirror 210 for measuring the position of the XY stage 105 is arranged on the XY stage 105.

The control system circuit 160 includes control computer 110, a memory 112, a deflection control circuit 130, digital-to-analog converting (DAC) amplifier units 132 and 134, a stage position detector 139, and storage devices 140, 142, and 144, such as magnetic disk drives. The control computer 110, the memory 112, the deflection control circuit 130, the DAC amplifier units 132 and 134, the stage position detector 139, and the storage devices 140, 142, and 144 are connected with each other through a bus (not shown). The deflection control circuit 130 is connected to the DAC amplifier units 132 and 134, and a blanking aperture array mechanism 204. Outputs of the DAC amplifier unit 132 are connected to the deflector 209. Outputs of the DAC amplifier unit 134 are connected to the deflector 208. The stage position detector 139 irradiates the mirror 210 on the XY stage 105 with a laser beam, and receives a reflected light from the mirror 210. Then, the stage position detector 139 measures the position of the XY stage 105 by using the principle of the laser interference based on information on the reflected light.

In the control computer 110, there are arranged a rasterizing unit 50, a dose map generation unit 52, a beam-positional-deviation map generation unit 54, a selection unit 56, a search unit 58, a combination setting unit 60, a dose distribution ratio calculation unit 62, a dose distribution coefficient calculation unit 64, a dose distribution table generation unit 66, a dose modulation unit 68, and a writing control unit 72. Each of " . . . units" such as the rasterizing unit 50, the dose map generation unit 52, the beam-positional-deviation map generation unit 54, the selection unit 56, the search unit 58, the combination setting unit 60, the dose distribution ratio calculation unit 62, the dose distribution coefficient calculation unit 64, the dose distribution table generation unit 66, the dose modulation unit 68, and the writing control unit 72 includes a processing circuitry. As the processing circuitry, for example, an electric circuit, computer, processor, circuit board, quantum circuit, or semiconductor device is used. Each " . . . unit" may use a common processing circuitry (same processing circuitry), or different processing circuitries (separate processing circuitries). Information input and output to/from the rasterizing unit 50, the dose map generation unit 52, the beam-positional-deviation map generation unit 54, the selection unit 56, the search unit 58, the combination setting unit 60, the dose distribution ratio calculation unit 62, the dose distribution coefficient calculation unit 64, the dose distribution table generation unit 66, the dose modulation unit 68, and the writing control unit 72, and information being operated are stored in the memory 112 each time.

Moreover, writing data is input from the outside of the writing apparatus 100, and stored in the storage device 140. The writing data usually defines information on a plurality of figure patterns to be written. Specifically, it defines a figure code, coordinates, size, etc. of each figure pattern.

FIG. 1 shows structure elements necessary for describing the first embodiment. It should be understood that other structure elements generally necessary for the writing apparatus 100 may also be included therein.

Figure 2:
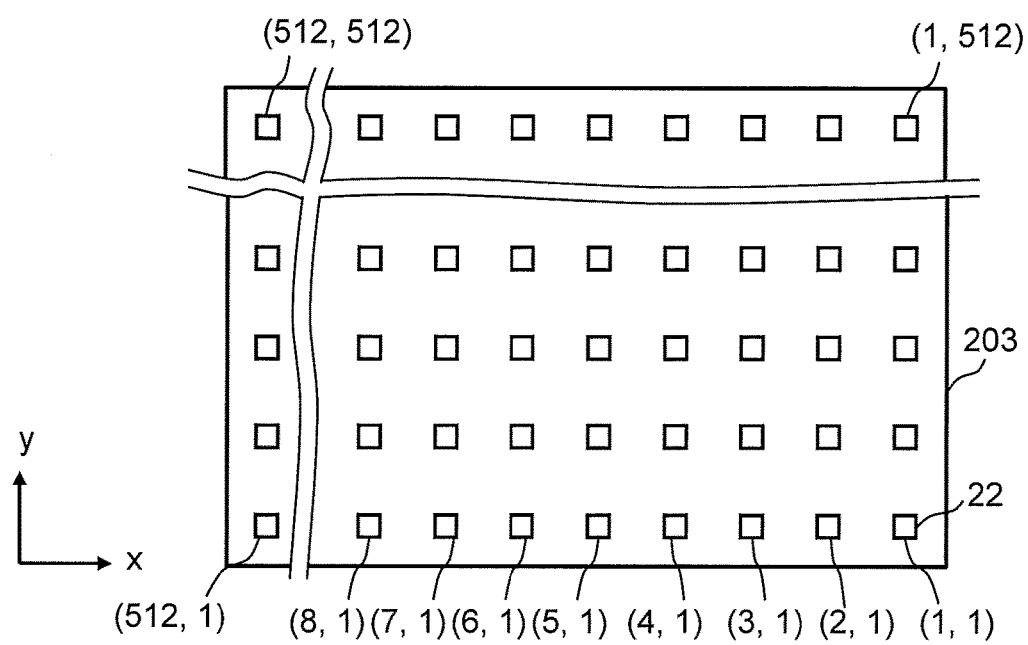
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings, apertures) 22 of p rows long (length in the y direction) and q columns wide (width in x direction) (p≥2, q≥2) are formed, like a matrix, at a predetermined arrangement pitch in the shaping aperture array substrate 203. In FIG. 2, for example, holes 22 of 512 (rows of holes arrayed in y direction)×512 (columns of holes arrayed in x direction) are formed. Each of the holes 22 is a quadrangle (rectangle) having the same dimension and shape. Alternatively, each of the holes 22 may be a circle with the same diameter. By making portions of an electron beam 200 individually pass through a corresponding hole of a plurality of holes 22, multiple beams 20 are formed. The method of arranging the holes 22 is not limited to the case of FIG. 2 where holes are arranged in a grid form in the length and width directions. For example, with respect to the kth and the (k+1)th rows which are arrayed (accumulated) in the length direction (y direction), each hole in the kth row and each hole in the (k+1)th row may be mutually displaced in the width direction (x direction) by a dimension "a". Similarly, with respect to the (k+1)th and the (k+2)th rows which are arrayed (accumulated) in the length direction (y direction), each hole in the (k+1)th row and each hole in the (k+2)th row may be mutually displaced in the width direction (x direction) by a dimension "b", for example.

Figure 3:
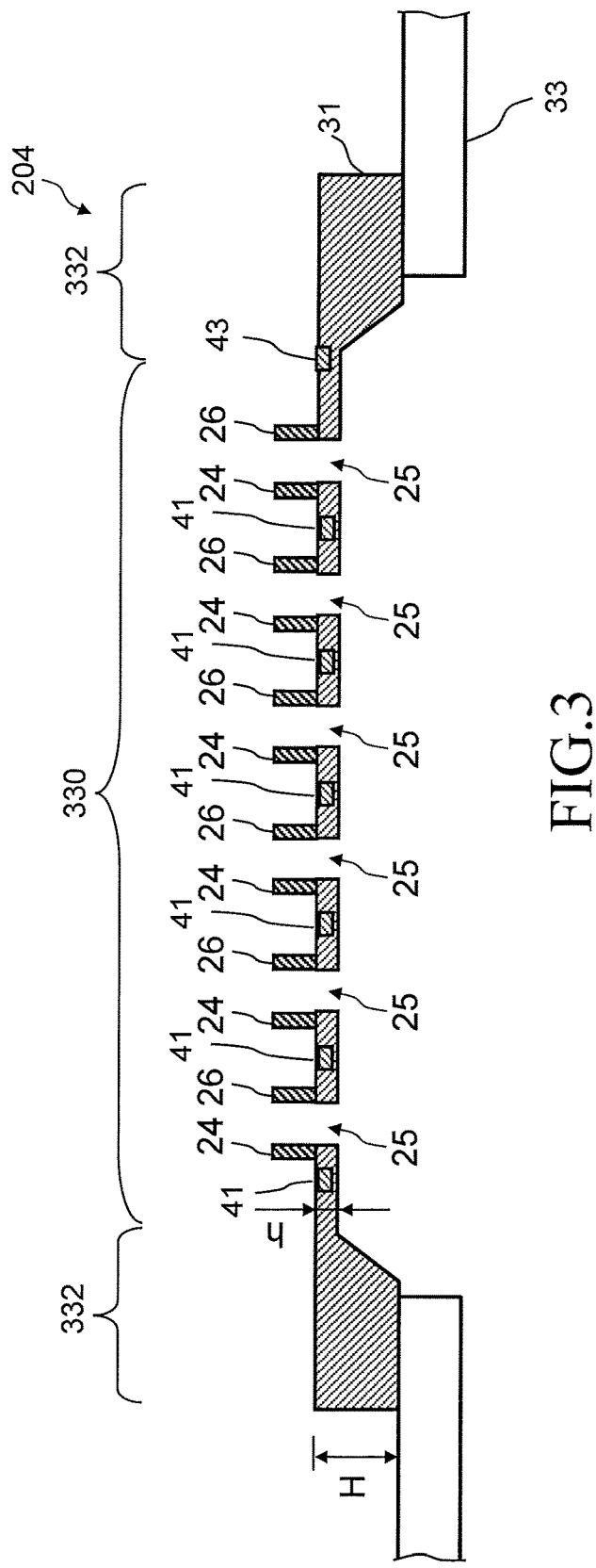
FIG. 3 is a sectional view showing a configuration of a blanking aperture array mechanism according to the first embodiment.

FIG. 3 is a sectional view showing a configuration of a blanking aperture array mechanism according to the first embodiment.

Figure 4:
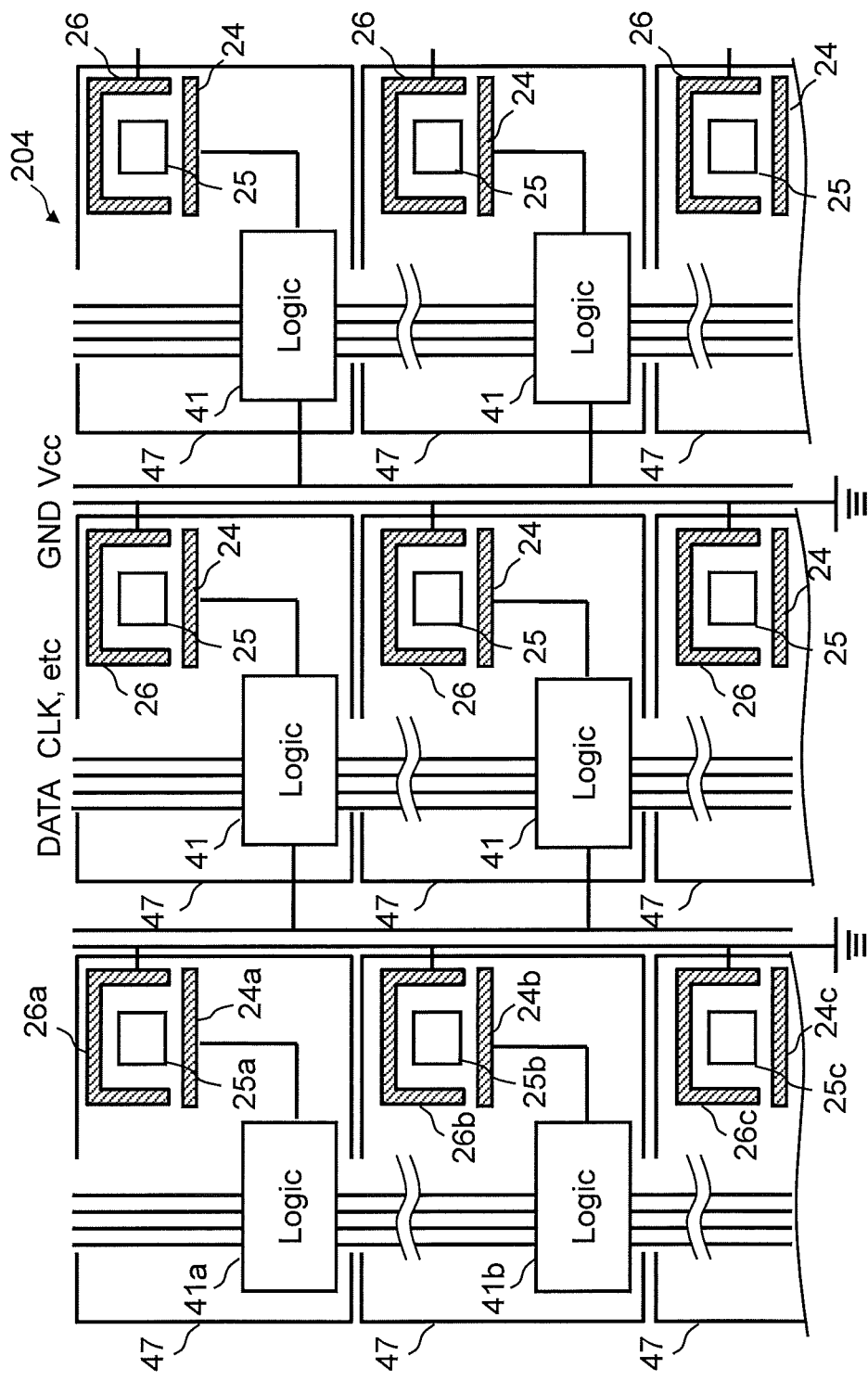
FIG. 4 is a top view conceptual diagram showing a portion of the structure in a membrane region of a blanking aperture array mechanism according to the first embodiment.

FIG. 4 is a top view conceptual diagram showing a portion of the structure in a membrane region of a blanking aperture array mechanism according to the first embodiment. The position relation of a control electrode 24, a counter electrode 26, a control circuit 41, and a pad 43 in FIG. 3 is not in accordance with that of FIG. 4. With regard to the structure of the blanking aperture array mechanism 204, a semiconductor substrate 31 made of silicon, etc. is placed on a support table 33. The central part of the substrate 31 is shaved from the back side, and made into a membrane region 330 (first region) having a thin film thickness h. The periphery surrounding the membrane region 330 is an outer peripheral region 332 (second region) having a thick film thickness H. The upper surface of the membrane region 330 and the upper surface of the outer peripheral region 332 are formed to be flush or substantially flush in height with each other. At the back side of the outer peripheral region 332, the substrate 31 is supported on the support table 33. The central part of the support table 33 is open, and the membrane region 330 is located at this opening region.

In the membrane region 330, passage holes 25 (openings) through each of which a corresponding one of multiple beams passes are formed at positions each corresponding to each hole 22 of the shaping aperture array substrate 203 shown in FIG. 2. In other words, in the membrane region 330 of the substrate 31, there are formed a plurality of passage holes 25 in an array through each of which a corresponding beam of electron multiple beams passes. Moreover, in the membrane region 330 of the substrate 31, there are arranged a plurality of electrode pairs each composed of two electrodes being opposite to each other with respect to a corresponding one of a plurality of passage holes 25. Specifically, in the membrane region 330, as shown in FIGS. 3 and 4, each pair (blanker: blanking deflector) of the control electrode 24 and the counter electrode 26 for blanking deflection is arranged close to a corresponding passage hole 25 in a manner such that the electrodes 24 and 26 are opposite to each other across the passage hole 25 concerned. Moreover, close to each passage hole 25 in the membrane region 330 of the substrate 31, there is arranged the control circuit 41 (logic circuit) for applying a deflection voltage to the control electrode 24 for the passage hole 25 concerned. The counter electrode 26 for each beam is grounded (earthed).

As shown in FIG. 4, n-bit (e.g., 10-bit) parallel lines for control signals are connected to each control circuit 41. In addition to the n-bit parallel lines for controlling signals, lines for a clock signal, a read signal, a shot signal, a power supply, and the like are connected to each control circuit 41. Alternatively, a part of the parallel lines may be used as the lines for a clock signal, a read signal, a shot signal, a power supply, and the like. An individual blanking mechanism 47 composed of the control electrode 24, the counter electrode 26, and the control circuit 41 is configured for each of the multiple beams. In the example of FIG. 3, the control electrode 24, the counter electrode 26, and the control circuit 41 are arranged in the membrane region 330 having a thin film thickness of the substrate 31. However, it is not limited thereto. A plurality of control circuits 41 formed in an array in the membrane region 330 are grouped, for example, per row or per column, and the control circuits 41 in each group are connected in series as shown in FIG. 4. Then, the pad 43 arranged for each group sends a signal to the control circuits 41 in the group concerned. Specifically, a shift register (not shown) is arranged in each control circuit 41, and for example, shift registers in the control circuits 41 for beams in the same row in p×g multiple beams, for example, are connected in series. For example, control signals for beams in the same row in the p×q multiple beams are transmitted in series, and, for example, a control signal for each beam is stored in a corresponding control circuit 41 by p clock signals totally.

Figure 5:
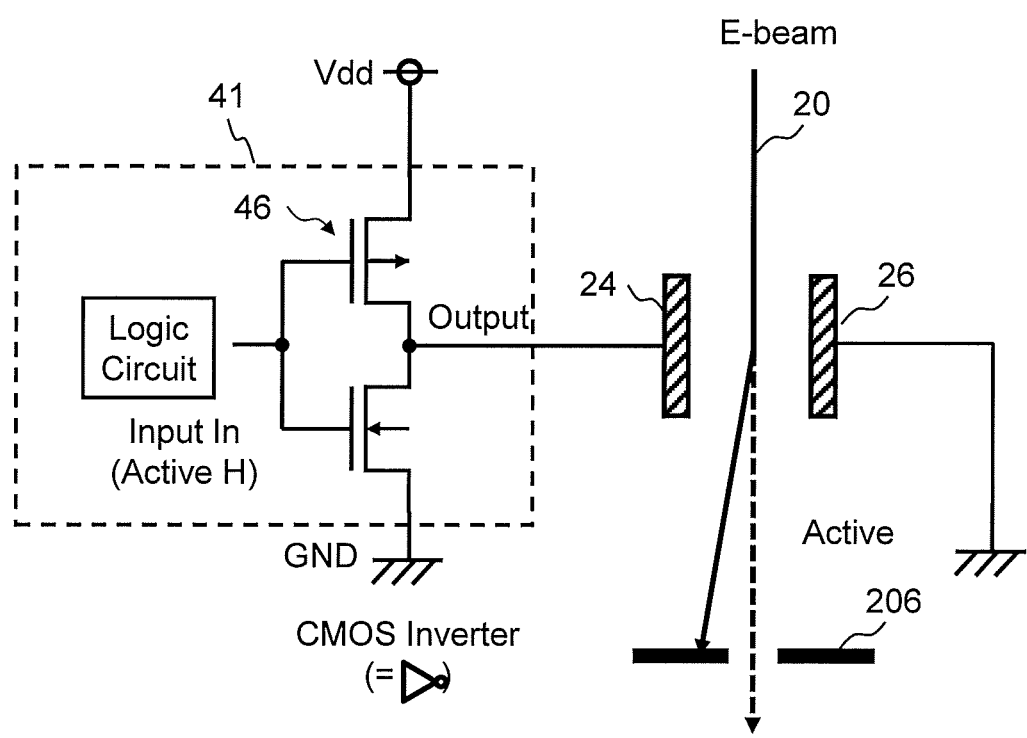
FIG. 5 shows an example of an individual blanking mechanism according to the first embodiment.

FIG. 5 shows an example of an individual blanking mechanism according to the first embodiment. As shown in FIG. 5, an amplifier 46 (an example of a switching circuit) is arranged in the control circuit 41. In the case of FIG. 5, a CMOS (complementary MOS) inverter circuit is arranged as an example of the amplifier 46. The CMOS inverter circuit is connected to a positive potential (Vdd: blanking electric potential: first electric potential) (e.g., 5 V) (first electric potential) and to a ground potential (GND: second electric potential). The output line (OUT) of the CMOS inverter circuit is connected to the control electrode 24. On the other hand, the counter electrode 26 is applied with a ground electric potential. A plurality of control electrodes 24, each of which is applied with a blanking electric potential and a ground electric potential in a switchable manner, are arranged on the substrate 31 such that each control electrode 24 and the corresponding counter electrode 26 are opposite to each other with respect to a corresponding one of a plurality of passage holes 25.

As an input (IN) of each CMOS inverter circuit, either an L (low) electric potential (e.g., ground potential) lower than a threshold voltage, or an H (high) electric potential (e.g., 1.5 V) higher than or equal to the threshold voltage is applied as a control signal. According to the first embodiment, in a state where an L electric potential is applied to the input (IN) of the CMOS inverter circuit, the output (OUT) of the CMOS inverter circuit becomes a positive potential (Vdd), and then, a corresponding beam 20 is deflected by an electric field due to a potential difference from the ground potential of the counter electrode 26 so as to be blocked by the limiting aperture substrate 206, thereby being controlled to be in a beam OFF condition. On the other hand, in a state (active state) where an H electric potential is applied to the input (IN) of the CMOS inverter circuit, the output (OUT) of the CMOS inverter circuit becomes a ground potential, and therefore, since there is no potential difference from the ground potential of the counter electrode 26, a corresponding beam 20 is not deflected, thereby being controlled to be in a beam ON condition by making the beam concerned pass through the limiting aperture substrate 206.

The electron beam 20 passing through a corresponding passage hole is deflected by a voltage independently applied to a pair of the control electrode 24 and the counter electrode 26. Blanking control is performed by this deflection. Specifically, a pair of the control electrode 24 and the counter electrode 26 individually provides blanking deflection of a corresponding beam of multiple beams by an electric potential switchable by the CMOS inverter circuit which serves as a corresponding switching circuit. Thus, each of a plurality of blankers performs blanking deflection of a corresponding beam in the multiple beams having passed through a plurality of holes 22 (openings) in the shaping aperture array substrate 203.

Figure 6:
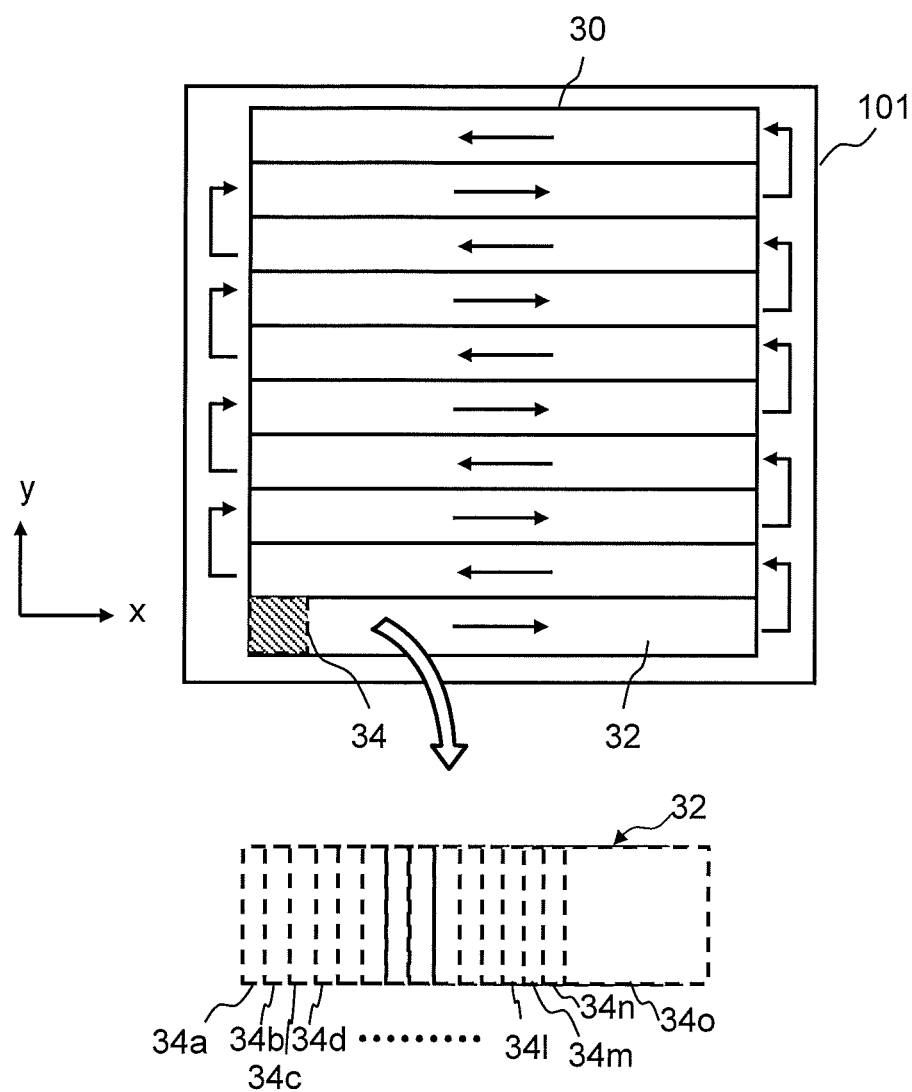
FIG. 6 is a conceptual diagram explaining an example of a writing operation according to the first embodiment.

FIG. 6 is a conceptual diagram explaining an example of a writing operation according to the first embodiment. As shown in FIG. 6, a writing region 30 of the target object 101 is virtually divided by a predetermined width in the y direction into a plurality of stripe regions 32 in a strip form, for example. First, the XY stage 105 is moved to make an adjustment such that an irradiation region 34 which can be irradiated with one shot of the multiple beams 20 is located at the left end of the first stripe region 32 or at a position further left than the left end, and then writing is started. When writing the first stripe region 32, the XY stage 105 is moved, for example, in the −x direction, so that the writing proceeds relatively in the x direction. The XY stage 105 is moved, for example, continuously at a constant speed. After writing the first stripe region 32, the stage position is moved in the −y direction to make an adjustment such that the irradiation region 34 is located at the right end of the second stripe region 32 or at a position further right than the right end and located relatively in the y direction. Then, by moving the XY stage 105 in the x direction, for example, writing proceeds in the −x direction. That is, writing is performed while alternately changing the direction, such as performing writing in the x direction in the third stripe region 32, and in the −x direction in the fourth stripe region 32, thereby reducing the writing time. However, the writing operation is not limited to the writing while alternately changing the direction, and it is also preferable to perform writing in the same direction when writing each stripe region 32. A plurality of shot patterns up to as many as the number of the holes 22 are formed at a time by one shot of multiple beams having been formed by passing through the holes 22 in the shaping aperture array substrate 203.

Figure 7:
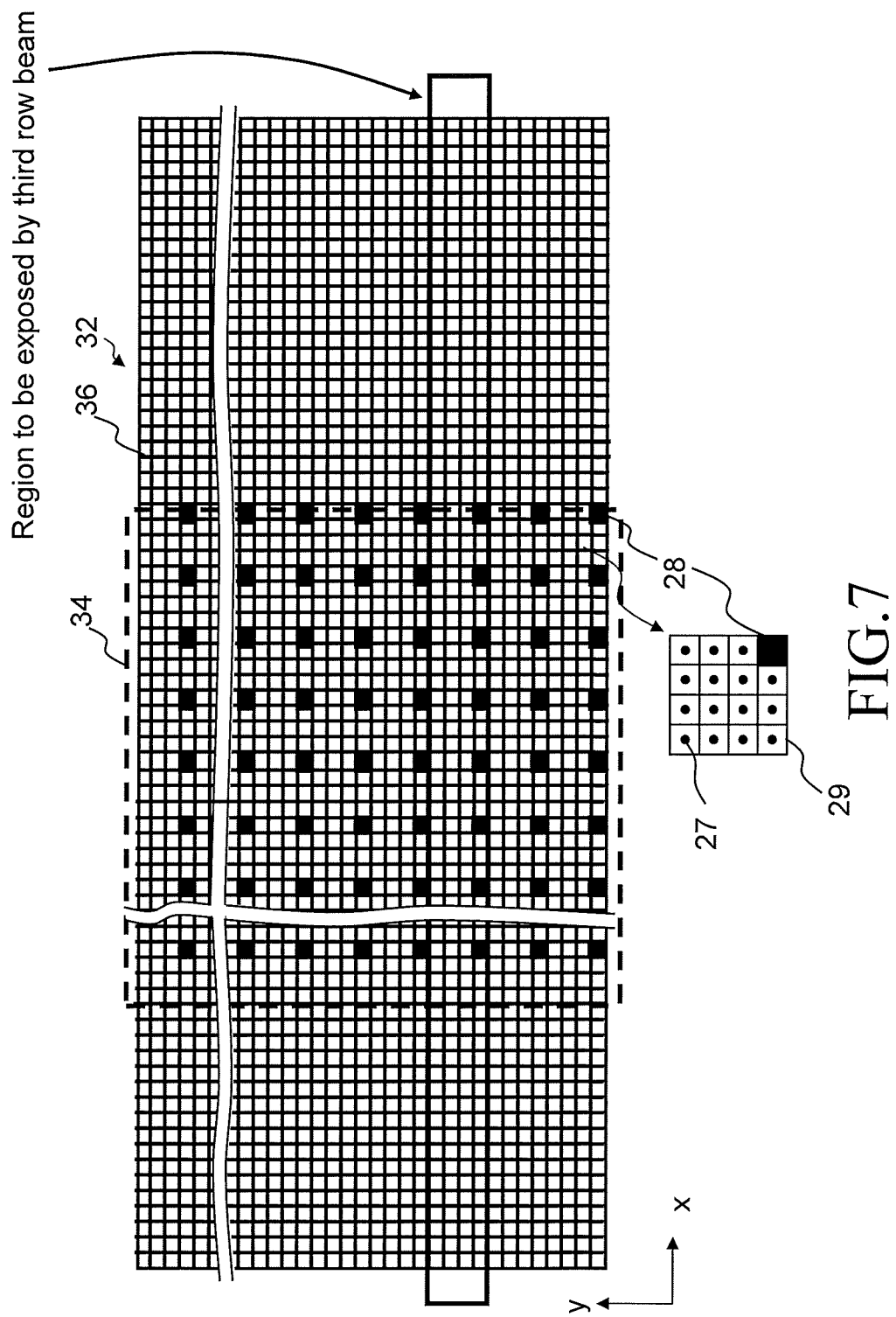
FIG. 7 shows an example of an irradiation region of multiple beams and a pixel to be written according to the first embodiment.

FIG. 7 shows an example of an irradiation region of multiple beams and a pixel to be written (writing target pixel) according to the first embodiment. In FIG. 7, in the stripe region 32, there are set a plurality of control grids 27 (design grids) arranged in a grid form at the beam size pitch of the multiple beams 20 on the surface of the target object 101, for example. Preferably, they are arranged at an arrangement pitch of around 10 nm. A plurality of control grids 27 serve as design irradiation positions of the multiple beams 20. The arrangement pitch of the control grid 27 is not limited to the beam size, and may be an arbitrary size which can be controlled as a deflecting position of the deflector 209, regardless of the beam size. Then, a plurality of pixels 36 obtained by virtually dividing into a mesh form by the same size as that of the arrangement pitch of the control grid 27 are set, each of which is centering on each control grid 27. Each pixel 36 serves as an irradiation unit region per beam of multiple beams. FIG. 7 shows the case where the writing region of the target object 101 is divided, for example, in the y direction, into a plurality of stripe regions 32 by the width size being substantially the same as the size of the irradiation region 34 (writing field) which can be irradiated with one irradiation of the multiple beams 20. The size in the x direction of the irradiation region 34 can be defined by the value obtained by multiplying the pitch between beams in the x direction of the multiple beams 20 by the number of beams in the x direction. The size in the y direction of the irradiation region 34 can be defined by the value obtained by multiplying the pitch between beams in the y direction of the multiple beams 20 by the number of beams in the y direction. The width of the stripe region 32 is not limited to this. Preferably, the width of the stripe region 32 is n times (n being an integer of 1 or more) the size of the irradiation region 34. FIG. 7 shows the case of multiple beams of 512×512 (rows×columns) being simplified to 8×8 (rows×columns). In the irradiation region 34, there are shown a plurality of pixels 28 (beam writing positions) which can be irradiated with one shot of the multiple beams 20. In other words, the pitch between adjacent pixels 28 is the pitch between beams of the design multiple beams. In the example of FIG. 7, one sub-irradiation region 29 is a square region surrounded by four adjacent pixels 28 at four corners and including one of the four pixels 28. In the case of FIG. 7, each sub-irradiation region 29 is composed of 4×4 pixels.

Figure 8:
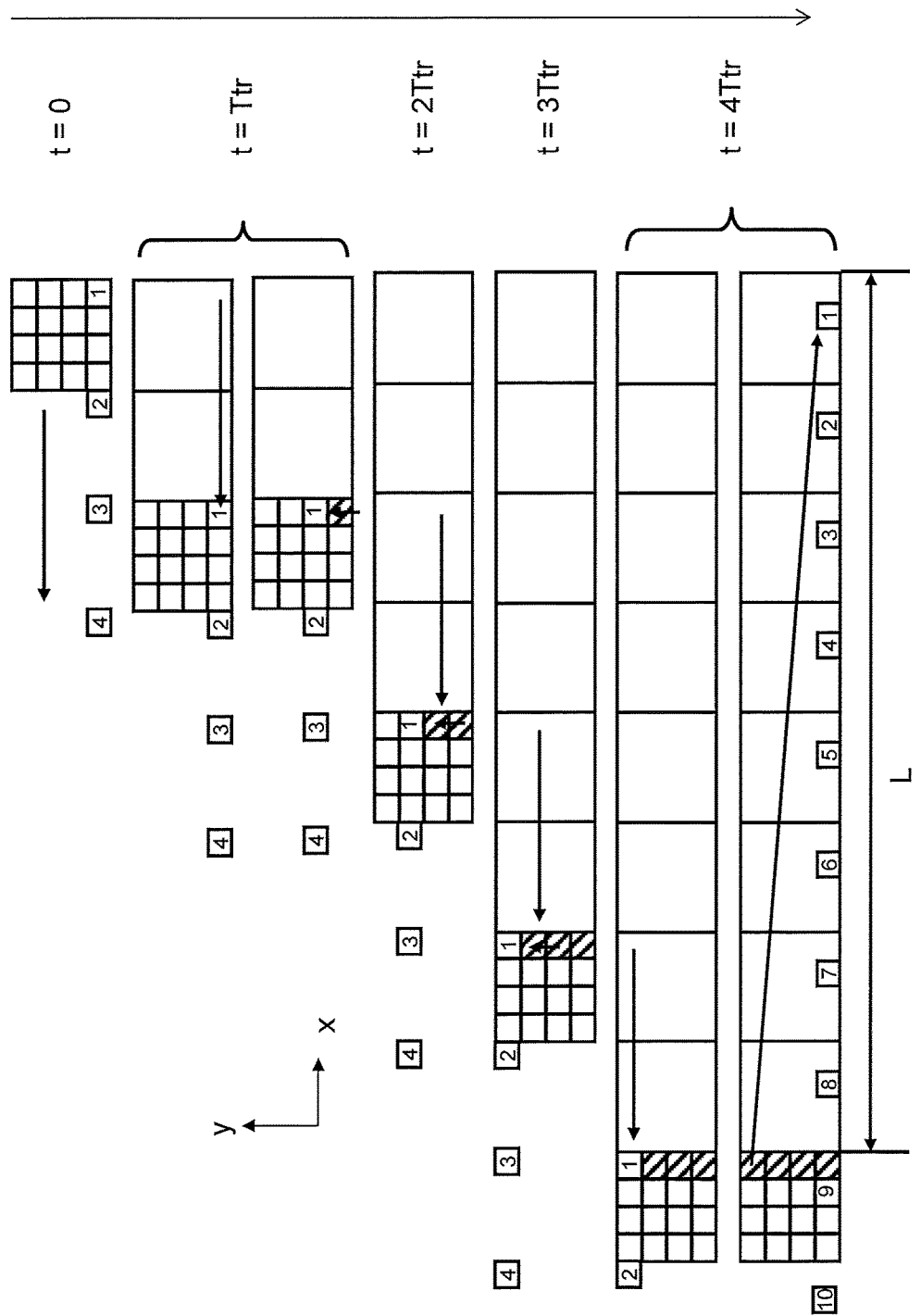
FIG. 8 illustrates an example of a writing method of multiple beams according to the first embodiment.

FIG. 8 illustrates an example of a writing method of multiple beams according to the first embodiment. FIG. 8 shows a part of the sub-irradiation region 29 to be written by respective beams at the coordinates (1, 3), (2, 3), (3, 3), ..., (512, 3) in the third row from the bottom in the multiple beams for writing the stripe region 32 shown in FIG. 7. In the example of FIG. 8, while the XY stage 105 moves the distance of eight beam pitches, four pixels are written (exposed), for example. In order that the relative position between the irradiation region 34 and the target object 101 may not shift by the movement of the XY stage 105 while these four pixels are written (exposed), the irradiation region 34 is made to follow the movement of the XY stage 105 by collectively deflecting the entire multiple beams 20 by the deflector 208. In other words, tracking control is performed. In the example of FIG. 8, one tracking cycle is executed by writing (exposing) four pixels while moving the distance of eight beam pitches.

Specifically, the stage position measuring instrument 139 measures the position of the XY stage 105 by irradiating the mirror 210 with a laser and receiving a reflected light from the mirror 210. The measured position of the XY stage 105 is output to the control computer 110. In the control computer 110, the writing control unit 72 outputs the position information on the XY stage 105 to the deflection control circuit 130. In accordance with the movement of the XY stage 105, the deflection control circuit 130 calculates deflection amount data (tracking deflection data) for deflecting beams to follow the movement of the XY stage 105. The tracking deflection data being a digital signal is output to the DAC amplifier 134. The DAC amplifier 134 converts the digital signal to an analog signal and amplifies it to be applied as a tracking deflection voltage to the main deflector 208.

The writing mechanism 150 irradiates each control grid 27 with a corresponding beam in an ON state in the multiple beams 20 during a writing time (irradiation time or exposure time) corresponding to each control grid 27 within a maximum irradiation time Ttr of the irradiation time of each of the multiple beams of the shot concerned.

In the example of FIG. 8, the control grid 27 of the first pixel 36 from the right in the bottom row of the sub-irradiation region 29 concerned is irradiated with the first shot of the beam (1) at coordinates (1, 3) during the time from t=0 to t=maximum irradiation time Ttr, for example. Thereby, the pixel concerned has received beam irradiation of a desired irradiation time. The XY stage 105 moves two beam pitches in the −x direction during the time from t=0 to t=Ttr, for example. During this time period, the tracking operation is continuously performed.

After the maximum irradiation time Ttr of the shot concerned has passed since the start of beam irradiation of the shot concerned, while the beam deflection for tracking control is continuously performed by the deflector 208, the writing position (previous writing position) of each beam is shifted to a next writing position (current writing position) of each beam by collectively deflecting the multiple beams 20 by the deflector 209, which is performed in addition to the beam deflection for tracking control. In the example of FIG. 8, when the time becomes t=Ttr, the writing target control grid 27 to be written is shifted from the control grid 27 of the first pixel 36 from the right in the bottom row of the sub-irradiation region 29 concerned, to the control grid 27 of the first pixel 36 from the right in the second row from the bottom. Since the XY stage 105 is moving at a fixed speed also during this time period, the tracking operation is continuously performed.

Then, while the tracking control is continuously performed, respective corresponding beams in the ON state in the multiple beams 20 are applied to the shifted writing positions corresponding to the respective beams during a writing time corresponding to each of the respective beams within the maximum irradiation time Ttr of the shot concerned. In the example of FIG. 8, the control grid 27 of the first pixel 36 from the right in the second row from the bottom of the sub-irradiation region 29 concerned is irradiated with the second shot of the beam (1) at the coordinates (1, 3) during the time from t=Ttr to t=2Ttr, for example. The XY stage 105 moves two beam pitches in the −x direction during the time from t=Ttr to t=2Ttr, for example. During this time period, the tracking operation is continuously performed.

In the example of FIG. 8, when the time becomes t=2Ttr, the writing target control grid 27 to be written is shifted from the control grid 27 of the first pixel 36 from the right in the second row from the bottom of the sub-irradiation region 29 concerned to the control grid 27 of the first pixel 36 from the right in the third row from the bottom. Since the XY stage 105 is moving also during this time period, the tracking operation is continuously performed. Then, the control grid 27 of the first pixel 36 from the right in the third row from the bottom of the sub-irradiation region 29 concerned is irradiated with a beam of the third shot of the beam (1) at the coordinates (1, 3) during the time from t=2Ttr to t=3Ttr, for example. Thereby, the control grid 27 of the pixel 36 concerned has received beam irradiation of a desired irradiation time.

The XY stage 105 moves two beam pitches in the −x direction during the time from t=2Ttr to t=3Ttr, for example. During this time period, the tracking operation is continuously performed. When the time becomes t=3Ttr, the writing target grid 27 to be written is shifted from the control grid 27 of the first pixel 36 from the right in the third row from the bottom of the sub-irradiation region 29 concerned to the control grid 27 of the first pixel 36 from the right in the fourth row from the bottom by collectively deflecting the multiple beams by the deflector 209. Since the XY stage 105 is moving also during this time period, the tracking operation is continuously performed.

The control grid 27 of the first pixel 36 from the right in the fourth row from the bottom of the sub-irradiation region 29 concerned is irradiated with a beam of the fourth shot of the beam (1) at the coordinates (1, 3) during the time from t=3Ttr to t=4Ttr, for example. Thereby, the control grid 27 of the pixel 36 concerned has received beam irradiation of a desired irradiation time.

The XY stage 105 moves two beam pitches in the −x direction during the time from t=3Ttr to t=4Ttr, for example. During this time period, the tracking operation is continuously performed. In this manner, writing of the pixels in the first column from the right of the sub-irradiation region 29 concerned has been completed.

In the example of FIG. 8, after applying a corresponding beam to the writing position of each beam which has been shifted three times from the initial position, the DAC amplifier unit 134 returns the tracking position to the start position of tracking where the tracking control was started, by resetting the beam deflection for tracking control. In other words, the tracking position is returned in the opposite direction to the direction of the stage movement. In the example of FIG. 8, when the time becomes t=4Ttr, tracking of the sub-irradiation region 29 concerned is cancelled, and the beam is swung back to a new sub-irradiation region 29 which has been shifted by eight beam pitches in the x direction. Although the beam (1) at the coordinates (1, 3) has been described in the example of FIG. 8, writing is also similarly performed for each sub-irradiation region 29 corresponding to a beam at other coordinates. That is, the beam at coordinates (n, m) completes writing of pixels in the first column from the right of a corresponding sub-irradiation region 29 when the time becomes t=4Ttr. For example, the beam (2) at coordinates (2, 3) completes writing of pixels in the first column from the right of the sub-irradiation region 29 adjacent in the −x direction to the sub-irradiation region 29 for the beam (1) of FIG. 8.

Since writing of the pixels in the first column from the right of each sub-irradiation region 29 has been completed, in a next tracking cycle after resetting the tracking, the deflector 209 performs deflection such that the writing position of each corresponding beam is adjusted (shifted) to the second pixel from the right in the first row from the bottom of each sub-irradiation region 29.

As described above, each shot is performed while shifting one control grid 27 (pixel 36) by one control grid 27 (pixel 36) by the deflector 209, in a state where the relative position of the irradiation region 34 to the target object 101 is controlled by the deflector 208 to be an unchanged position during the same tracking cycle. Then, after finishing one tracking cycle and returning the tracking position of the irradiation region 34, as shown in the lower part of FIG. 6, the shot position for the first shot is adjusted to the position shifted by one control grid (one pixel), for example, and each shot is performed shifting one control grid (one pixel) by one control grid (one pixel) by the deflector 209 while performing a next tracking control. By repeating this operation during writing the stripe region 32, the position of the irradiation region 34 is shifted one by one, such as from 34a to 34o, to perform writing of the stripe region concerned.

When writing the target object 101 with the multiple beams 20, as described above, irradiation is performed per control grid (one pixel) sequentially and continuously with multiple beams 20, serving as shot beams, by moving the beam deflection position by the deflector 209 while following the movement of the XY stage 105 during the tracking operation by the deflector 208. It is determined, based on the writing sequence, which beam of multiple beams irradiates which control grid 27 (pixel 36) on the target object 101. Then, the region obtained by multiplying the beam pitch (x direction) by the beam pitch (y direction), where the beam pitch is between beams adjacent in the x or y direction of multiple beams on the surface of the target object 101, is configured by a region (sub-irradiation region 29) composed of n×n pixels. For example, when the XY stage 105 moves in the −x direction by the distance of the beam pitch (x direction) by one tracking operation, as described above, n control grids (n pixels) are written in the y direction by one beam while the irradiation position is shifted. Alternatively, n control grids (n pixels) may be written in the x direction or diagonal direction by one beam while the irradiation position is shifted. Then, by the next tracking operation, other n pixels in the same n×n pixel region are similarly written by a different beam from the one used above. Thus, n pixels are written each time of n times of tracking operations, using a different beam each time, thereby writing all the pixels in one region of n×n pixels. With respect also to other regions each composed of n×n pixels in the irradiation region of multiple beams, the same operation is executed at the same time so as to perform writing similarly.

Next, operations of the writing mechanism 150 of the writing apparatus 100 will be described. The electron beam 200 emitted from the electron gun 201 (emission source) almost perpendicularly (e.g., vertically) illuminates the whole of the shaping aperture array substrate 203 by the illumination lens 202. A plurality of quadrangular holes (openings) are formed in the shaping aperture array substrate 203. The region including all the plurality of holes is irradiated with the electron beam 200. For example, a plurality of quadrangular electron beams (multiple beams) 20a to 20e are formed by letting portions of the electron beam 200, which irradiates the positions of a plurality of holes, individually pass through a corresponding hole of the plurality of holes of the shaping aperture array substrate 203. The multiple beams 20a to 20e individually pass through corresponding blankers (first deflector: individual blanking mechanism) of the blanking aperture array mechanism 204. Each blanker deflects (provides blanking deflection) the electron beam 20 which is individually passing.

The multiple beams 20a to 20e having passed through the blanking aperture array mechanism 204 are reduced by the reducing lens 205, and go toward the hole in the center of the limiting aperture substrate 206. At this stage, the electron beam 20a which was deflected by the blanker of the blanking aperture array mechanism 204 deviates (shifts) from the hole in the center of the limiting aperture substrate 206 and is blocked by the limiting aperture substrate 206. On the other hand, the electron beams 20b to 20e which were not deflected by the blanker of the blanking aperture array mechanism 204 pass through the hole in the center of the limiting aperture substrate 206 as shown in FIG. 1. Blanking control is provided by ON/OFF of the individual blanking mechanism so as to control ON/OFF of beams. Thus, the limiting aperture substrate 206 blocks each beam which was deflected to be in the OFF state by the individual blanking mechanism 47. Then, for each beam, one shot beam is formed by a beam which has been made during a period from becoming beam ON to becoming beam OFF and has passed through the limiting aperture substrate 206. The multiple beams 20 having passed through the limiting aperture substrate 206 are focused by the objective lens 207 so as to be a pattern image of a desired reduction ratio. Then, respective beams (the whole of the multiple beams 20) having passed through the limiting aperture substrate 206 are collectively deflected in the same direction by the deflectors 208 and 209 in order to irradiate respective beam irradiation positions on the target object 101. Ideally, the multiple beams 20 irradiating at a time are aligned at pitches obtained by multiplying the arrangement pitch of a plurality of holes of the shaping aperture array substrate 203 by a desired reduction ratio described above.

Figure 9:
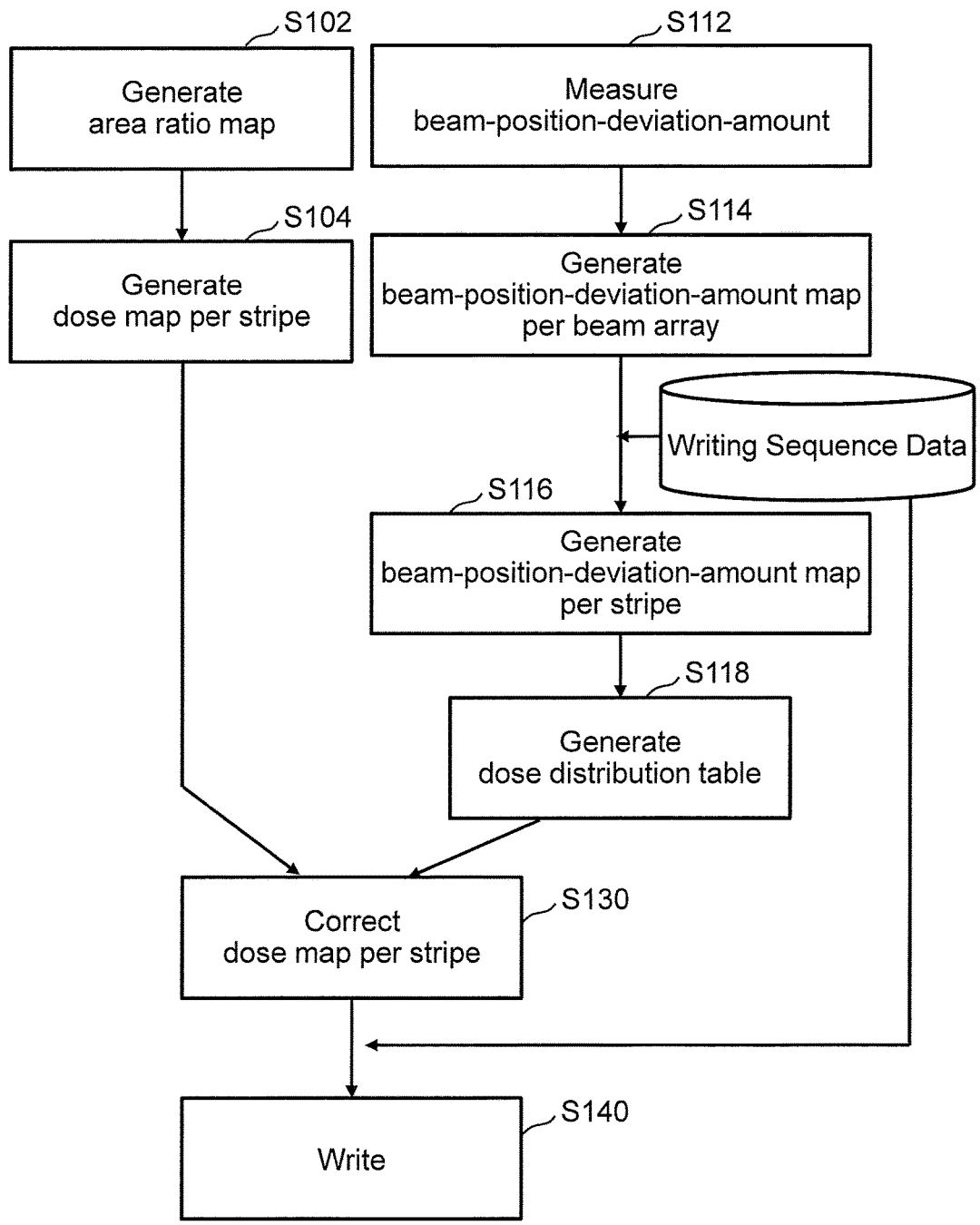
FIG. 9 is a flowchart showing main steps of a writing method according to the first embodiment.

FIG. 9 is a flowchart showing main steps of a writing method according to the first embodiment. In FIG. 9, the writing method of the first embodiment executes a series of steps: an area ratio map generation step (S102), a dose map generation step (S104) per stripe, a beam-positional-deviation-amount measurement step (S112), a beam-positional-deviation-amount map generation step (S114) per beam array, a beam-positional-deviation-amount map generation step (S116) per stripe, a dose distribution table generation step (S118), a dose map correction step (S130) per stripe, and a writing step (S140).

In the area ratio map generation step (rasterizing step) (S102), the rasterizing unit 50 reads writing data from the storage device 140, and calculates, for each pixel 36, a pattern area density ρ' in the pixel 36 concerned. This processing is performed for each stripe region 32, for example.

In the dose map generation step (S104) per stripe, first, the dose map generation unit 52 virtually divides the writing region (here, for example, stripe region 32) into a plurality of proximity mesh regions (mesh regions for proximity effect correction calculation) by a predetermined size. The size of the proximity mesh region is preferably about ¹⁄₁₀ of the influence range of the proximity effect, such as about 1 μm. The dose map generation unit 52 reads writing data from the storage device 140, and calculates, for each proximity mesh region, a pattern area density ρ of a pattern arranged in the proximity mesh region concerned.

Next, the dose map generation unit 52 calculates, for each proximity mesh region, a proximity-effect correction irradiation coefficient $D_p(x)$ (correction dose) for correcting a proximity effect. An unknown proximity-effect correction irradiation coefficient Dp(x) can be defined by a threshold value model for proximity-effect correction, which is the same as the one used in a conventional method, where a backscatter coefficient η, a dose threshold value Dth of a threshold value model, a pattern area density ρ, and a distribution function g(x) are used.

Next, the dose map generation unit 52 calculates, for each pixel 36, an incident dose $D(x)$ (dose) with which the pixel 36 concerned is irradiated. The incident dose $D(x)$ can be calculated, for example, by multiplying a pre-set base dose $D_{base}$, a proximity effect correction irradiation coefficient $D_p$, and a pattern area density ρ'. The base dose $D_{base}$ can be defined by Dth/(½+η), for example. Thereby, it is possible to obtain an originally desired incident dose $D(x)$, for which the proximity effect has been corrected, based on layout of a plurality of figure patterns defined by the writing data.

The dose map generation unit 52 generates, per stripe, a dose map which defines an incident dose $D(x)$ for each pixel 36. The incident dose $D(x)$ for each pixel 36 is an incident dose $D(x)$ planned in design to irradiate the control grid 27 of the pixel 36 concerned. In other words, the dose map generation unit 52 generates a dose map (1) which defines, per stripe, the incident dose $D(x)$ for each control grid 27. The generated dose map (1) is stored in the storage device 142, for example.

In the beam-positional-deviation-amount measurement step (S112), the writing apparatus 100 measures an amount of positional deviation from the control grid 27 corresponding to each beam of the multiple beams 20.

Figure 10B:
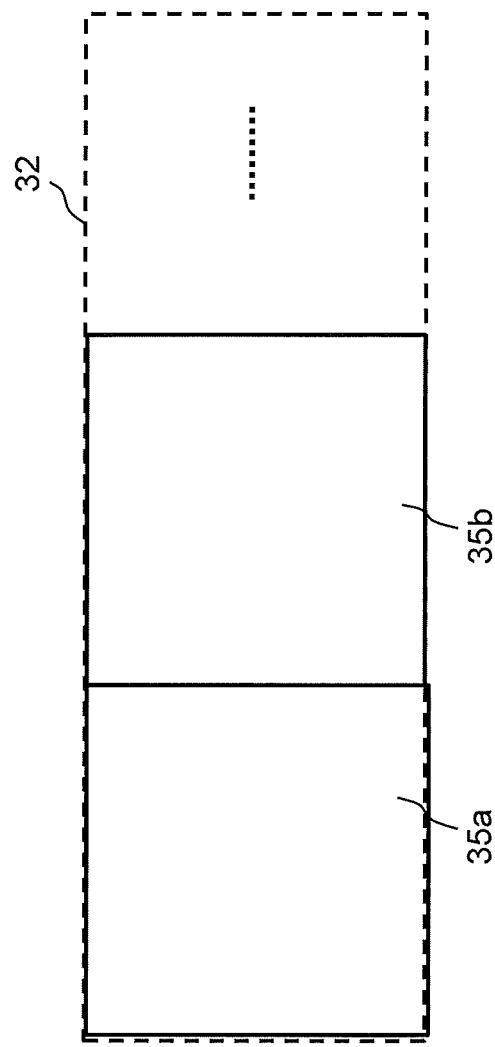
FIGS. 10A and 10B illustrate a beam positional deviation and a positional deviation periodicity according to the first embodiment.
Figure 10A:
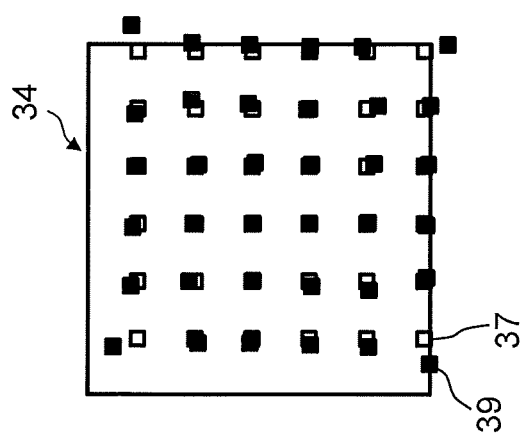

FIGS. 10A and 10B illustrate a beam positional deviation and a positional deviation periodicity according to the first embodiment. In the multiple beams 20, as shown in FIG. 10A, distortion occurs in an exposure field due to optical system characteristics, and therefore, an actual irradiation position 39 of each beam deviates from an irradiation position 37 of the ideal grid because of the distortion. Then, in the first embodiment, the amount of positional deviation of the actual irradiation position 39 of each beam is measured. Specifically, an evaluation substrate coated with resist is irradiated with the multiple beams 20, and the irradiated evaluation substrate is developed in order to generate a resist pattern. Then, the position of the generated resist pattern is measured by a position measuring instrument so as to measure a positional deviation amount of each beam. If it is difficult to measure the size of the resist pattern at the irradiation position of each beam by a position measuring instrument since the shot size of the beam concerned is small, it should perform to write a figure pattern (e.g., rectangular pattern) of measurable size by a position measuring instrument, measure edge positions of the both sides of the figure pattern (resist pattern), and measure a positional deviation amount of a target beam based on a difference between the intermediate position between the both edges and the intermediate position of a figure pattern in design. Then, data of an obtained positional deviation amount on the irradiation position of each beam is input into the writing apparatus 100, and stored in the storage device 144. Moreover, in the multi-beam writing, in the case of the writing sequence explained in FIG. 8, for example, since writing proceeds while shifting the irradiation region 34 in the stripe region 32, periodicity occurs in positional deviation of each beam every time the irradiation region 34 is moved because the position of the irradiation region 34 moves one by one, such as from the irradiation region 34a to 34o, during writing of the stripe region 32 as shown in the lower part of FIG. 6. Alternatively, in the case of the writing sequence where each beam irradiates all the pixels 36 in the sub irradiation region 29 corresponding to the beam concerned, as shown in FIG. 10B, periodicity occurs at least in the positional deviation of each beam in each unit region 35 (35a, 35b, . . . ) having the same size as the irradiation region 34. Therefore, if the positional deviation amount of each beam for one irradiation region 34 is measured, the measurement result can also be used for other regions. In other words, it is sufficient to measure a positional deviation amount at each pixel 36 in the sub irradiation region 29 corresponding to each beam.

In the beam-positional-deviation-amount map generation step (S114) per beam array, the beam-positional-deviation map generation unit 54 generates a beam-positional-deviation-amount map (1) (first beam-positional-deviation-amount map) which defines the amount of positional deviation of each beam in beam array units, in other words, the irradiation region 34. Specifically, the beam-positional-deviation map generation unit 54 reads positional deviation amount data on the irradiation position of each beam from the storage device 144, and generates the beam-positional-deviation-amount map (1) by using the data as a map value.

In the beam-positional-deviation-amount map generation step (S116) per stripe, the beam-positional-deviation map generation unit 54 generates a beam-positional-deviation-amount map (2) (second beam-positional-deviation-amount map) for the control grid 27 of each pixel 36 in the stripe region 32. Which beam irradiates the control grid 27 of each pixel 36 in the stripe region 32 is determined based on the writing sequence as shown in FIG. 8, for example. Therefore, for each control grid 27 of each pixel 36 in the stripe region 32, the beam-positional-deviation map generation unit 54 specifies a beam to irradiate the control grid 27 concerned according to the writing sequence, and calculates a positional deviation amount of the beam concerned. The beam-positional-deviation map generation unit 54 generates the beam-positional-deviation-amount map (2) for each stripe by using the amount of positional deviation of the irradiation position of a beam toward each control grid 27, as a map value. As described above, since periodicity occurs in the positional deviation of each beam, the beam-positional-deviation-amount map (2) for each stripe can be generated by using the value of the beam-positional-deviation-amount map (1) for each beam array.

In the dose distribution table generation step (S118), for each control grid 27, there is generated a dose distribution table for distributing a dose, which is set for the control grid 27 concerned, to surrounding beams.

Figure 11:
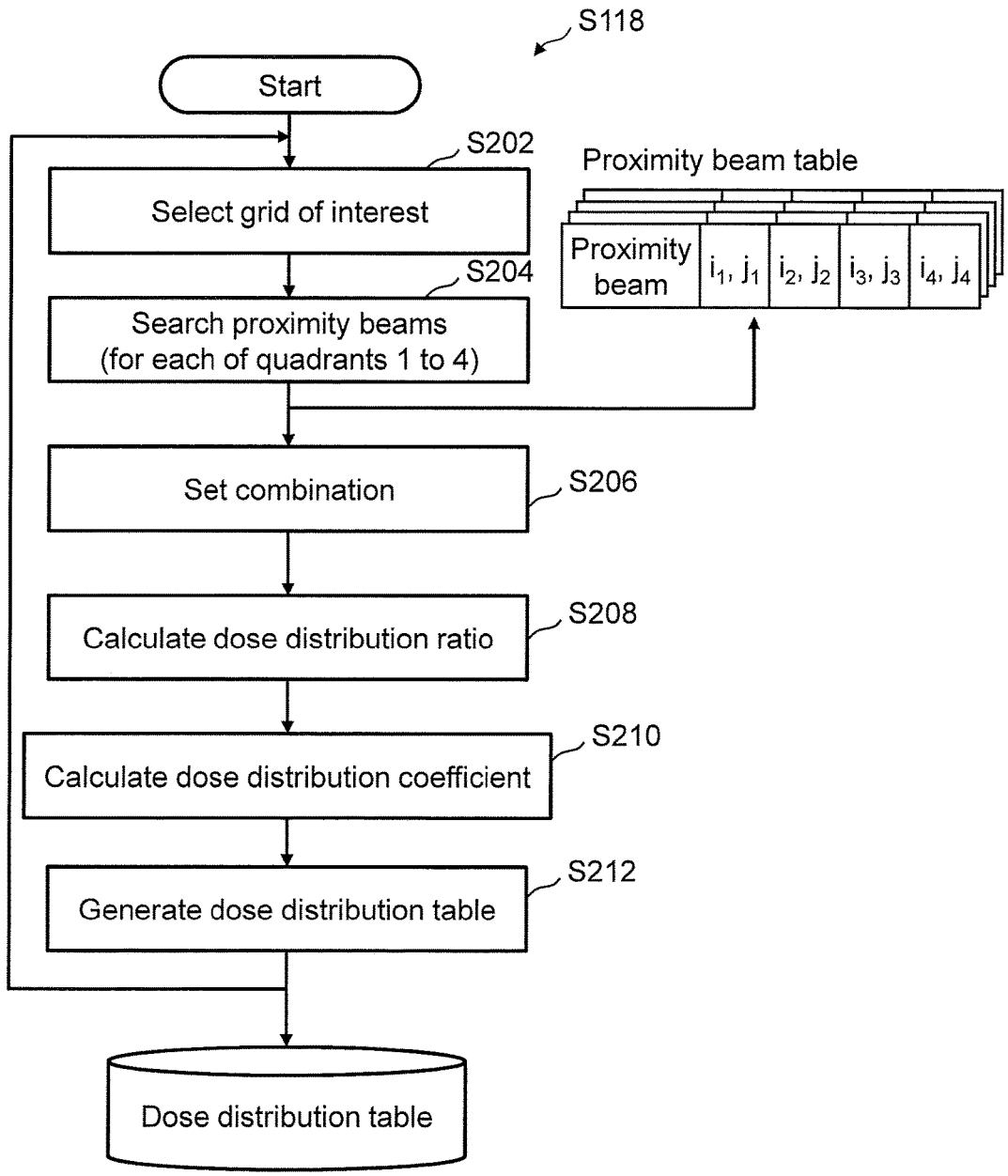
FIG. 11 is a flowchart showing an example of internal steps of the dose distribution table generation step according to the first embodiment.

FIG. 11 is a flowchart showing an example of internal steps of the dose distribution table generation step according to the first embodiment. In FIG. 11, the dose distribution table generation step (S118) executes a series of steps as internal steps: a target grid selection step (S202), a proximity beam search step (S204), a combination setting step (S206), a dose distribution ratio calculation step (S208), a dose distribution coefficient calculation step (S210), and a dose distribution table generation step (S212).

In the target grid selection step (S202), the selection unit 56 selects a control grid of interest (target control grid) in a plurality of control grids 27 in a target stripe region 32.

In the proximity beam search step (S204), for each control grid 27 in a plurality of control grids 27 (design grid) being irradiation positions in design of the multiple beams 20, the search unit 58 searches for four or more proximity beams whose actual irradiation positions are close to the control grid 27 concerned.

Figure 12:
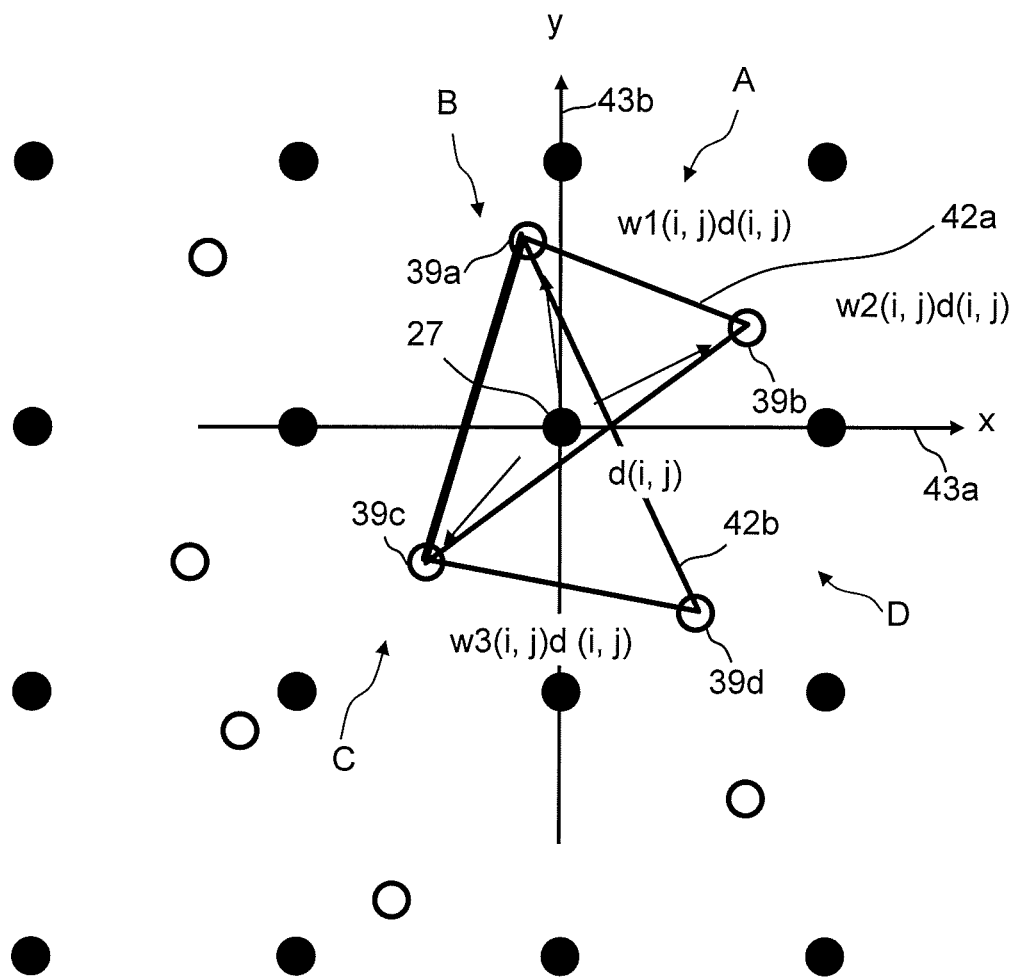
FIG. 12 illustrates a method of searching for a proximity beam according to the first embodiment.

FIG. 12 illustrates a method of searching for a proximity beam according to the first embodiment. Since a positional deviation occurs in a beam irradiating each control grid 27 as described above, the practical irradiation position (actual irradiation position) of each beam is deviated (shifted) from the control grid 27 corresponding to the beam concerned as shown in FIG. 12 FIG. 12 illustrates a method of searching for a proximity beam according to the first embodiment. Therefore, in FIG. 12, a plurality of actual irradiation positions 39 (white) exist around the target control grid 27 (grid of interest) (black) represented by the coordinates d(i, j). It is sufficient that the number of proximity beams is four or more. In the first embodiment, the case of searching for four proximity beams and selecting them will be described.

The search unit 58 (proximity beam selection unit) searches for and selects, for each control grid 27 (design grid), a beam corresponding to the closest irradiation position in each of four regions obtained by being divided by two straight lines which pass the control grid 27 concerned and have different angles, as four proximity beams whose actual irradiation positions are close to the control grid 27 concerned. An actual irradiation position can be acquired based on the beam-positional-deviation-amount map (2). In the example of FIG. 12, a straight line 43a parallel to the x-axis and a straight line 43b parallel to the y-axis, which are passing the target control grid 27 (grid of interest) represented by the coordinates d(i, j), are used as the two straight lines having different angles. In other words, the x-axis and the y-axis centering on a target grid are set. The region around the target grid is divided into four regions (first to fourth quadrants) by the x-axis and the y-axis. Then, the search unit 58 (proximity beam selection unit) selects a beam corresponding to the closest irradiation position 39b in the first quadrant (A), a beam corresponding to the closest irradiation position 39a in the second quadrant (B), a beam corresponding to the closest irradiation position 39c in the third quadrant (C), and a beam corresponding to the closest irradiation position 39d in the fourth quadrant (D).

Figure 13:
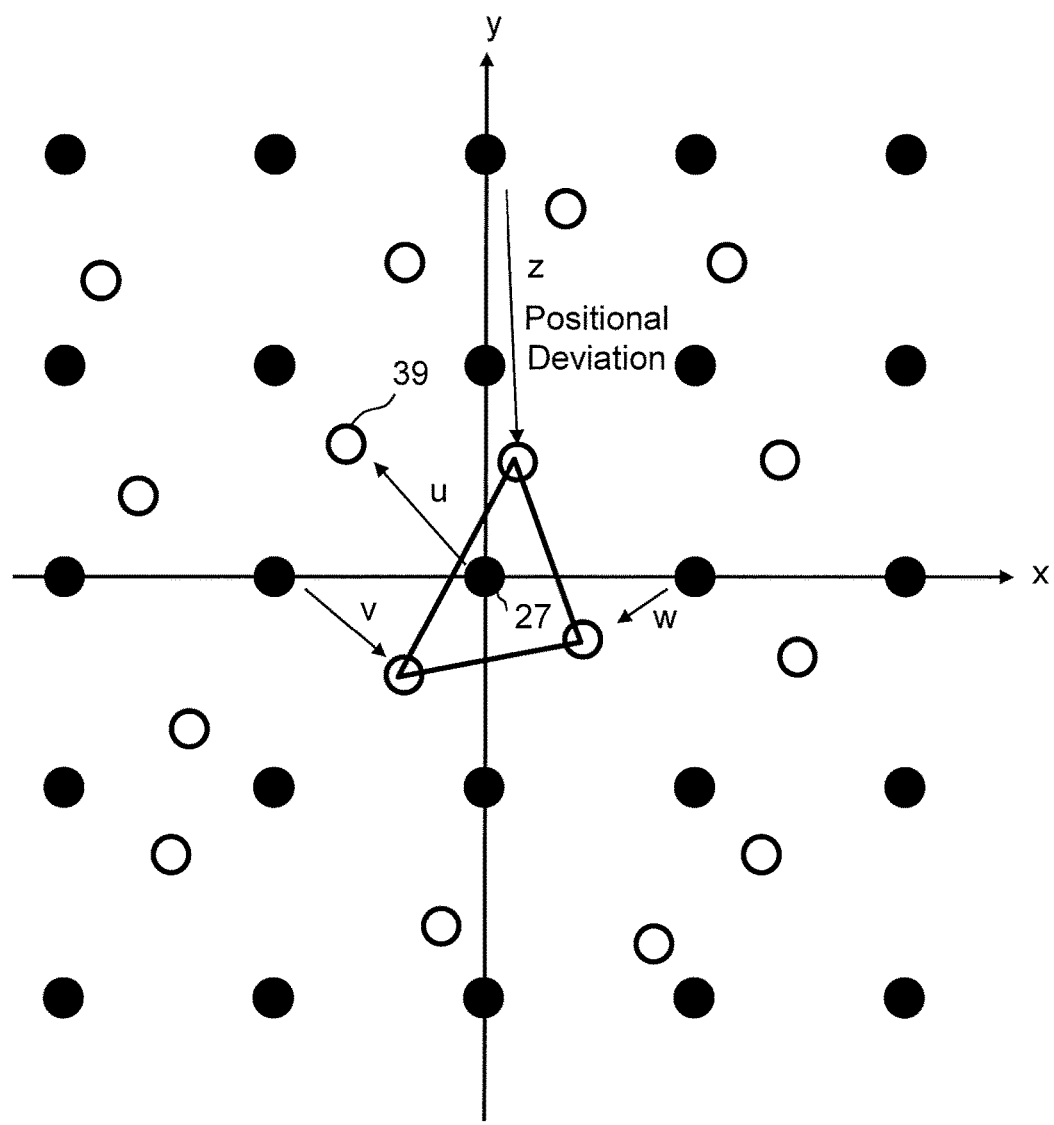
FIG. 13 shows an example of a control grid and an actual irradiation position of each beam according to the first embodiment.

FIG. 13 shows an example of a control grid and an actual irradiation position of each beam according to the first embodiment. FIG. 13 shows the case (U) where the actual irradiation position 39 of a beam corresponding to the target control grid 27 (control grid of interest) located in the center deviates to the upper left side (−x and +y direction). Moreover, FIG. 13 shows the case (V) where the actual irradiation position 39 of a beam corresponding to a control grid adjacent in the −x direction to the target control grid 27 deviates to the lower right side (+x and −y direction). Moreover, FIG. 13 shows the case (W) where the actual irradiation position 39 of a beam corresponding to a control grid adjacent in the +x direction to the target control grid 27 deviates to the lower left side (−x and −y direction). Moreover, FIG. 13 shows the case (Z) where the actual irradiation position 39 of a beam corresponding to a control grid adjacent but one in the +y direction to the target control grid 27 deviates by a longer distance than the control grid pitch size to the lower right side (+x and −y direction). As described in the example of FIG. 13, the direction of positional deviation of a beam corresponding to each control grid 27 (black) is not necessarily the same. Moreover, the actual irradiation position 39 (white) of a beam corresponding to each control grid 27 (black) does not necessarily exist between a target grid and a control grid adjacent to the target grid. Positional deviation may occur at the position farther than the distance of the control grid pitch size. It is sufficient for the search unit 58 to select a beam whose actual irradiation position 39 is closest in each quadrant, independent of the correspondence relation between the control grid 27 and the beam.

In the combination setting step (S206), for each of a plurality of control grids 27 being irradiation positions in design of the multiple beams 20, the combination setting unit 60 sets a plurality of combinations 42a and 41b each composed of three beams whose actual irradiation positions 39 surround the control grid 27 concerned, by using four or more beams whose actual irradiation positions 39 are close to the control grid 27 concerned. In the example of FIG. 12, one combination 42a is set using three proximity beams of a beam corresponding to the closest irradiation position 39b in the first quadrant (A), a beam corresponding to the closest irradiation position 39a in the second quadrant (B), and a beam corresponding to the closest irradiation position 39c in the third quadrant (C). Another combination 42b is set using three proximity beams of a beam corresponding to the closest irradiation position 39a in the second quadrant (B), a beam corresponding to the closest irradiation position 39c in the third quadrant (C), and a beam corresponding to the closest irradiation position 39d in the fourth quadrant (D). When selecting one proximity beam from each quadrant in order to surround the target control grid 27 (grid of interest), usually, there are two combinations.

In the dose distribution ratio calculation step (S208), the dose distribution ratio calculation unit 62 (first distribution coefficient calculation unit) calculates, for each of a plurality of combinations, a distribution ratio $w_k'$ (first distribution coefficient) for each of three beams configuring the combination concerned, for distributing a dose to irradiate the control grid 27 concerned to the three beams configuring the combination concerned, such that the position of the gravity center of each distributed dose coincides with the position of the control grid 27 concerned and the sum of each distributed dose after distribution coincides with the dose to irradiate the control grid 27 concerned.

FIGS. 14A to 14D illustrate a method for distributing a dose to surrounding three proximity beams according to the first embodiment. FIG. 14A shows actual irradiation positions 39 (white) of three beams to irradiate the periphery of the target grid (control grid 27) (black). The coordinates of the irradiation positions 39 of the three beams are $(x_1, y_1)$, ($x_2$, $y_2$), and ($x_3$, $y_3$). When representing the coordinates of the irradiation positions 39 of the three beams by using relative positions whose origin is the coordinates (x, y) of the target grid (control grid 27), the relative coordinates are ($\Delta x_1$, $\Delta y_1$), ($\Delta x_2$, $\Delta y_2$), and ($\Delta x_3$, $\Delta y_3$). When distributing the dose d to irradiate the target grid (control grid 27) of the coordinates (x, y) to the three beams, for making the position of the gravity center of each of doses $d_1$, $d_2$, and $d_3$ (distributed dose) after distribution be the coordinates (x, y), and making the sum of each of the doses $d_1$, $d_2$, and $d_3$ (distributed dose) after distribution be the dose d, the determinant shown in FIG. 14B should be satisfied. In other words, each of the doses d1, d2, and d3 after distribution is determined to satisfy the following equations (1) to (3).

$$x_1 \cdot d_1 + x_2 \cdot d_2 + x_3 \cdot d_3 = x \quad (1)$$

$$y_1 \cdot d_1 + y_2 \cdot d_2 + y_3 \cdot d_3 = y \quad (2)$$

$$d_1 + d_2 + d_3 = d \quad (3)$$

Therefore, each of the doses $d_1$, $d_2$, and $d_3$ (distributed dose) after distribution can be calculated from the determinant shown in FIG. 14C. In other words, each dose $d_k$ after distribution (that is, distributed dose) can be defined by multiplying the dose d to irradiate a target grid (control grid 27) by the distribution ratio $w_k'$ shown in FIG. 14D. Accordingly, the distribution ratio $w_k'$ for each of three beams around a target grid (control grid 27) (black) can be obtained by the calculation of FIG. 14C. In other words, the distribution ratio $w_k'$ for each of three beams satisfies the following equations (4) to (7).

$$d_1 = w_1' \cdot d \quad (4)$$

$$d_2 = w_2' \cdot d \quad (5)$$

$$d_3 = w_3' \cdot d \quad (6)$$

$$w_1' + w_2' + w_3' = 1 \quad (7)$$

In the dose distribution coefficient calculation step (S210), the dose distribution coefficient calculation unit 64 (second distribution coefficient calculation unit) calculates, for each of four or more beams (here, e.g., four beams), a distribution coefficient $w_k$ (second distribution coefficient) of each of four or more beams (here, e.g., four beams) relating to the control grid 27 (design grid) concerned by dividing the total of distribution ratios $w_k'$ (first distribution coefficient) corresponding to the beam concerned by the number of a plurality of combinations. At the stage of the dose distribution ratio calculation step (S208), only a distribution ratio $w_k'$ for each of three beams configuring the combination concerned has been calculated for each combination. However, with respect to a target grid (control grid 27) (black), a plurality of combinations exist in which a beam is used for not only for one combination but also for another combination. Therefore, two of four beams obtained from the four quadrants are used for configuring two combinations, for example. In the case of FIG. 12, the beam at the irradiation position 39a is used for the combinations 42a and 42b. Similarly, the beam at the irradiation position 39c is used for the combinations 42a and 42b. Thus, with respect to the beams at the irradiation positions 39a and 39c, the distribution ratio $w_k'$ in the case of the combination 42a and the distribution ratio $w_k'$ in the case of the combination 42b are individually calculated. On the other hand, the beam at the irradiation position 39b is used for the combination 42a, but not for the combination 42b. Therefore, with respect to the beam at the irradiation position 39b, the distribution ratio $w_k'$ in the case of the combination 42a is calculated, but that in the case of the combination 42b is not calculated. In contrast, the beam at the irradiation position of 39d is used for the combination 42b, but not for the combination 42a. Thus, with respect to the beam at the irradiation position of 39d, the distribution ratio $w_k'$ in the case of the combination 42b is calculated, but that in the case of the combination 42a is not calculated. The total of distribution ratios $w_k'$ calculated for four beams selected for a target grid (control grid 27) (black) is "2" being the same number as that of the combinations. Then, the dose distributed according to combination is determined to be (1/number of combinations). Based on this calculation, the distribution coefficient $w_k$ for each beam, based on which the dose d to irradiate the control grid 27 concerned is distributed into four selected beams, is obtained for each target grid (control grid 27) (black).

In the dose distribution table generation step (S212), the dose distribution table generation unit 66 generates a dose distribution table in which the distribution coefficients $w_k$ for four beams calculated for each target grid (control grid 27) (black) are defined relating to the target grids (control grids 27).

Figure 15:
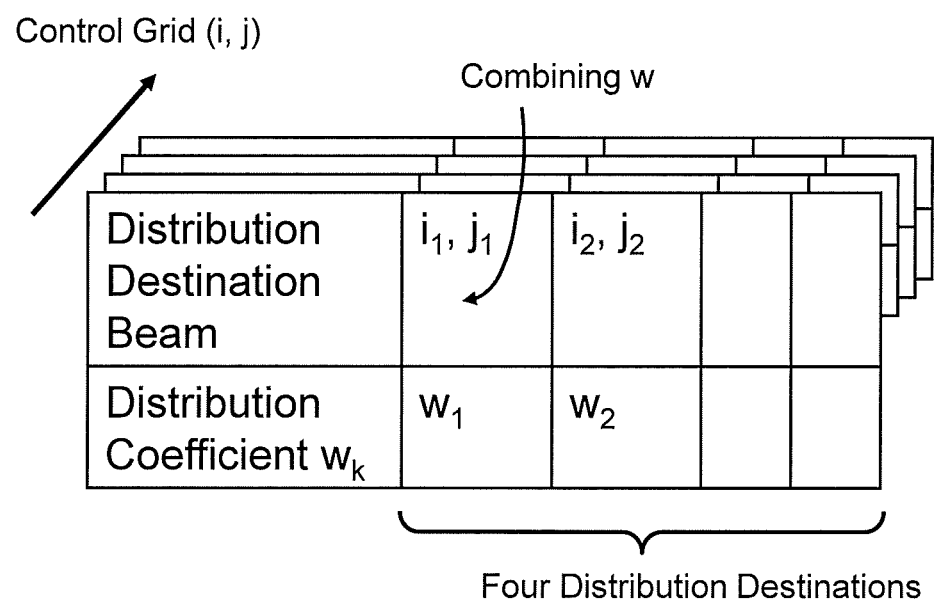
FIG. 15 shows an example of a dose distribution table according to the first embodiment.

FIG. 15 shows an example of a dose distribution table according to the first embodiment. In the case of FIG. 15, identification coordinates ($i_k$, $j_k$) of four beams being distribution destinations, and distribution coefficients $w_k$ for the four beams serving as the distribution destinations are defined for each target grid (control grid 27) (black) of coordinates (i, j).

After a dose distribution table has been generated for one target grid (control grid 27) (black), each step from the target grid selection step (S202) to the dose distribution table generation step (S212) is repeated, regarding a next control grid 27 as a target grid in order, until dose distribution tables have been generated for all the control grids in the stripe region concerned.

In the dose map correction step (S130) per stripe, the dose modulation unit 68 first reads a dose map (1), generated in the dose map generation step (S104) per stripe and defining the incident dose D for each control grid 27, from the storage device 142. Then, using the dose distribution table, the dose modulation unit 68 distributes a distribution dose, obtained by multiplying the incident dose D for the control grid 27 concerned by a calculated distribution coefficient $w_k$ of each of four beams serving as destinations of distribution, to each control grid 27 where irradiation positions in design of the four beams are respective destinations of the distribution. The dose modulation unit 68 corrects the incident dose D for each control grid 27 in the dose map by performing modulation by the distribution described above, and generates a modulated dose map (2) after correction. Preferably, the dose modulation unit 68 converts the modulated incident dose D after correction for each control grid 27 into an irradiation time t which has been graded by gray scale levels using a predetermined quantization unit $\Delta$ in order to define the irradiation time t in the modulated dose map (2).

In the writing step (S140), the writing mechanism 150 writes a pattern on the target object 101 with the multiple beams 20 in which the dose d to irradiate each control grid 27 (design grid) has been distributed to each corresponding one of four or more beams. Specifically, it operates as described below. The irradiation time t of a beam to each control grid 27 of the stripe region 32 to be written is defined in the modulated dose map (2). The writing control unit 72 rearranges irradiation time t data defined in the modulated dose map (2) in order of shot in accordance with the writing sequence. Then, the writing control unit 72 transmits the irradiation time t data to the deflection control circuit 130 in order of shot. The deflection control circuit 130 outputs a blanking control signal to the blanking aperture array mechanism 204 in order of shot, and a deflection control signal to the DAC amplifier units 132 and 134 in order of shot. The writing mechanism 150, as described above, performs writing on the target object 101 with the multiple beams 20 such that each control grid 27 is irradiated. Actually, although the irradiation position 39 of the beam to irradiate each control grid 27 deviates from the control grid 27 in design as described above, since dose modulation has been performed, positional deviation of a pattern formed on the resist pattern formed after exposure can be corrected.

Figure 16A:
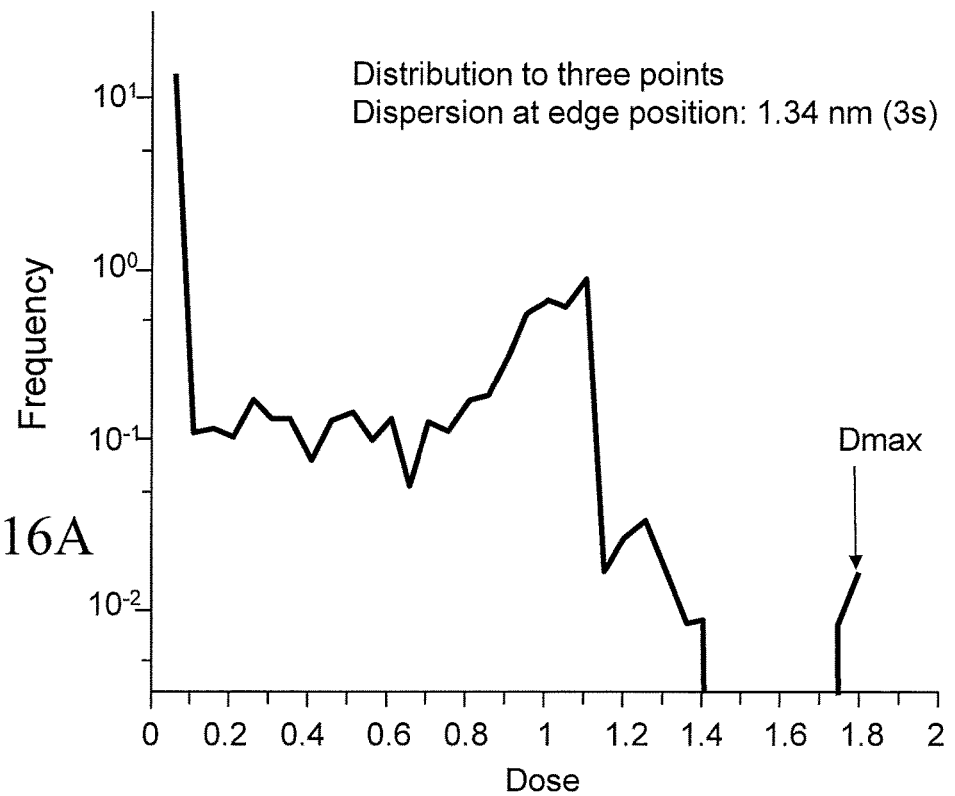
FIGS. 16A and 16B show examples of a dose frequency based on dose distribution according to the first embodiment.
Figure 16B:
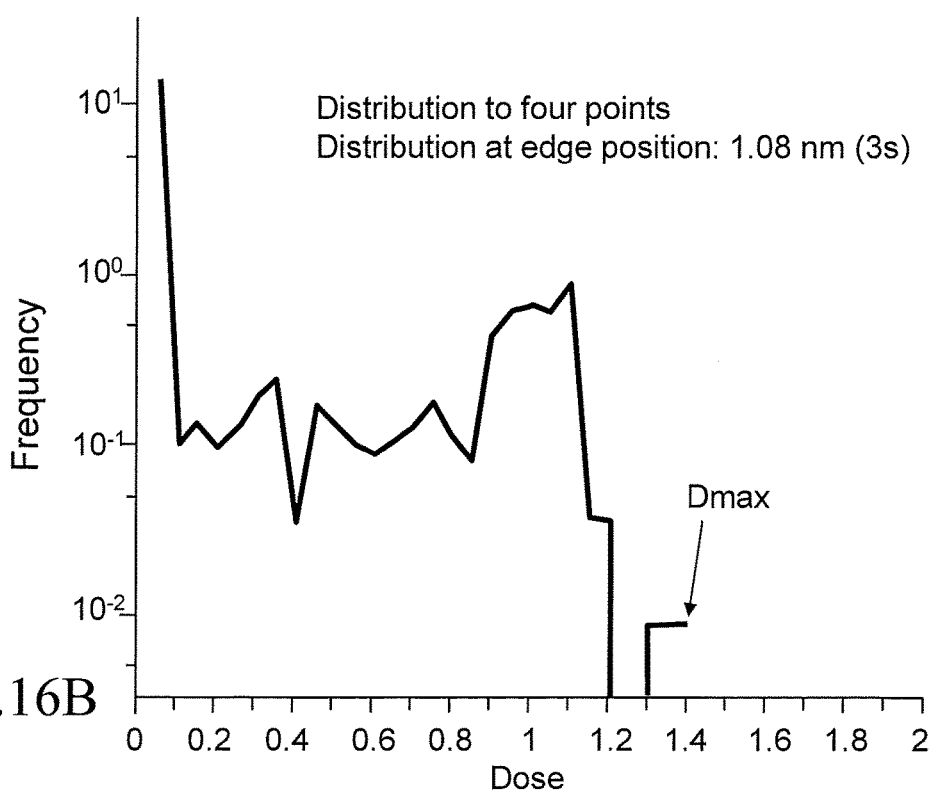

FIGS. 16A and 16B show examples of a dose frequency based on dose distribution according to the first embodiment. FIGS. 16A and 16B show examples of dose frequencies of all the shots of the multiple beams 20 to write the stripe region 32. When not distributing the dose to surrounding beams, the level of an incident dose (dose amount) to irradiate each control grid 27 (irradiation position) in the case of performing dose modulation needs to be, for example, several hundred percent of that of the base dose as described above. Therefore, the maximum irradiation time becomes further increased. In contrast, when distributing the incident dose (dose amount) to irradiate the control grid 27 to surrounding three beams, the maximum dose can be reduced to the value of 1.8 times the base dose as shown in the example of FIG. 16A. When distributing the incident dose (dose amount) to irradiate the control grid 27 to surrounding four beams as described in the first embodiment, the maximum dose can be further reduced to the value of 1.4 times the base dose as shown in the example of FIG. 16B. If distributing such a dose to four or more beams, the maximum dose may further be reduced. In other words, the maximum irradiation time in all the shots of the multiple beams 20 can be greatly reduced. Further, when distributing the incident dose (dose amount) to irradiate the control grid 27 to surrounding three beams, the value of dispersion of 3σ at the pattern edge to be written is 1.34 nm as shown in the example of FIG. 16A. In contrast, when distributing the incident dose (dose amount) to irradiate the control grid 27 to surrounding four beams as described in the first embodiment, the value of dispersion of 3G at the pattern edge to be written can be reduced to 1.08 nm as shown in the example of FIG. 16B, thereby also having a great effect of reducing the amount of positional deviation.

As described above, according to the first embodiment, it is possible to reduce the adjustment width of dose modulation in multi-beam writing. Accordingly, the maximum irradiation time can be shortened. Therefore, the throughput can be improved.

Second Embodiment

In the above first embodiment, the case has been described where the adjustment width of dose modulation is reduced premising to correct positional deviation occurring in a pattern to be written caused by positional deviation of the irradiation position. In a second embodiment, there will be described a configuration in which the adjustment width of dose modulation can be reduced further than that of the first embodiment in order to improve the throughput even at the cost of some correction effects for positional deviation occurring in a pattern.

Figure 17:
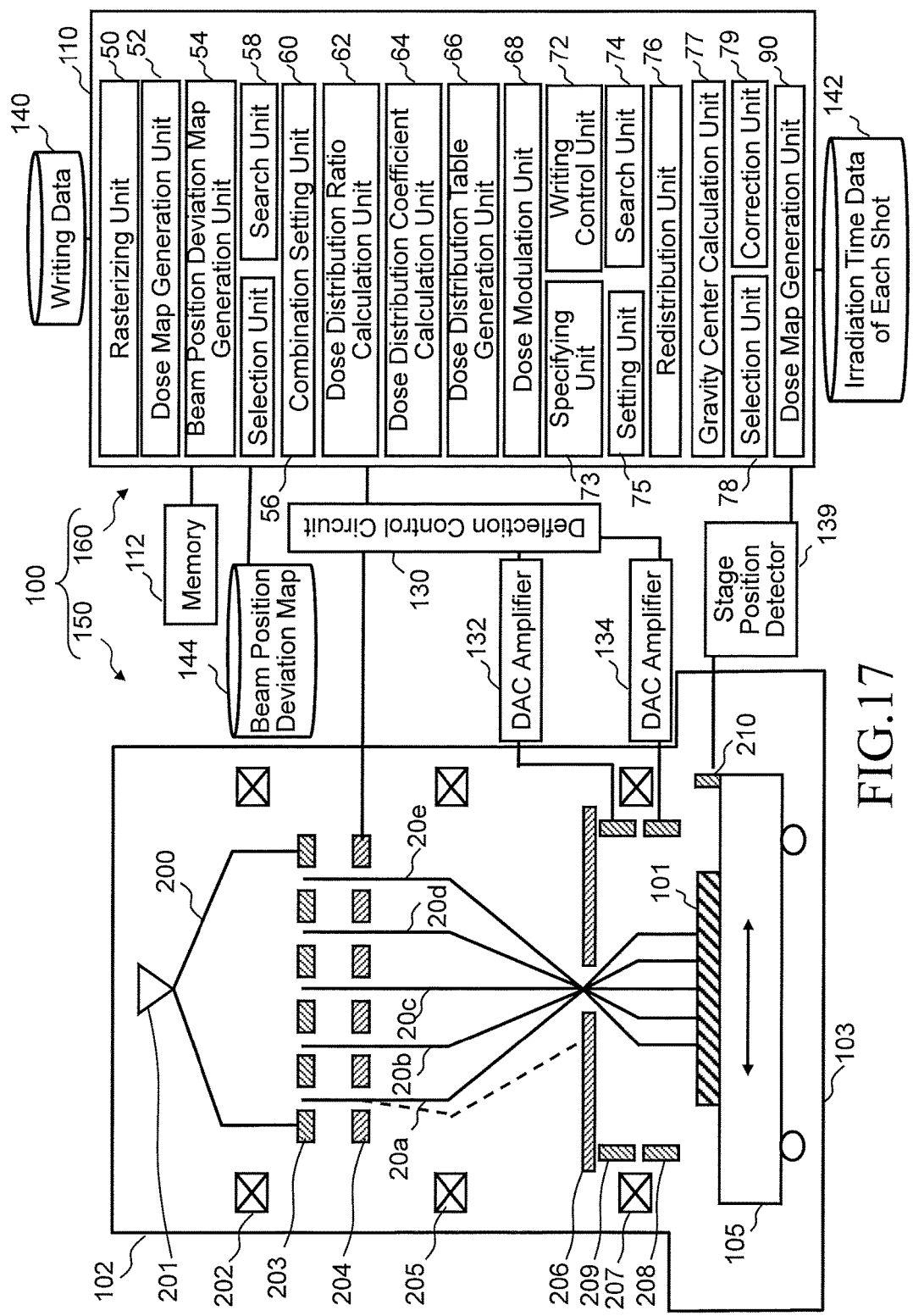
FIG. 17 is a conceptual diagram showing a configuration of a writing apparatus according to a second embodiment.

FIG. 17 is a conceptual diagram showing a configuration of a writing apparatus according to the second embodiment. FIG. 17 is the same as FIG. 1 except that, in the control computer 110, a specifying unit 73, a search unit 74, a setting unit 75, a redistribution unit 76, a gravity center calculation unit 77, a selection unit 78, a correction unit 79, and a dose map generation unit 90 are further arranged. Therefore, each of " . . . units" such as the rasterizing unit 50, the dose map generation unit 52, the beam-positional-deviation map generation unit 54, the selection unit 56, the search unit 58, the combination setting unit 60, the dose distribution ratio calculation unit 62, the dose distribution coefficient calculation unit 64, the dose distribution table generation unit 66, the dose modulation unit 68, the writing control unit 72, the specifying unit 73, the search unit 74, the setting unit 75, the redistribution unit 76, the gravity center calculation unit 77, the selection unit 78, the correction unit 79, and the dose map generation unit 90 includes a processing circuitry. As the processing circuitry, for example, an electric circuit, computer, processor, circuit board, quantum circuit, or semiconductor device is used. Each " . . . unit" may use a common processing circuitry (same processing circuitry), or different processing circuitries (separate processing circuitries). Information input and output to/from each of the above-described units, and information being operated are stored in the memory 112 each time.

Figure 18:
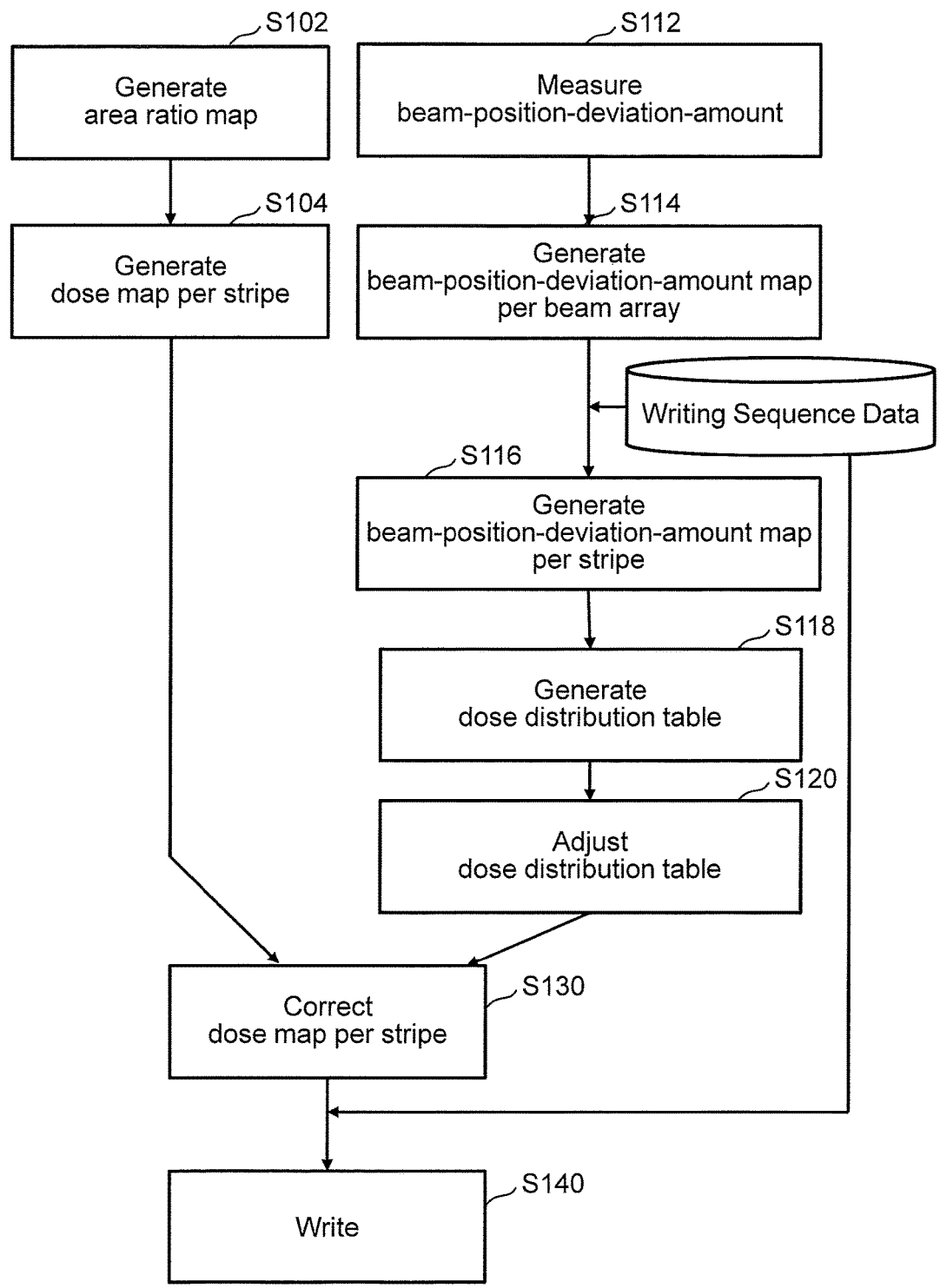
FIG. 18 is a flowchart showing main steps of a writing method according to the second embodiment.

FIG. 18 is a flowchart showing main steps of a writing method according to the second embodiment. FIG. 18 is the same as FIG. 9 except that a dose distribution table adjustment step (S120) is added between the dose distribution table generation step (S118) and the dose map correction step (S130) per stripe. The contents of the second embodiment are the same as those of the first embodiment except for what is specifically described below.

The contents of each of the area ratio map generation step (S102), the dose map generation step (S104) per stripe, the beam-positional-deviation-amount measurement step (S112), the beam-positional-deviation-amount map generation step (S114) per beam array, the beam-positional-deviation-amount map generation step (S116) per stripe, and the dose distribution table generation step (S118) are the same as those of the first embodiment.

In the dose distribution table adjustment step (S120), the generated dose distribution table is adjusted in order to partially correct the method for distributing the dose.

Figure 19:
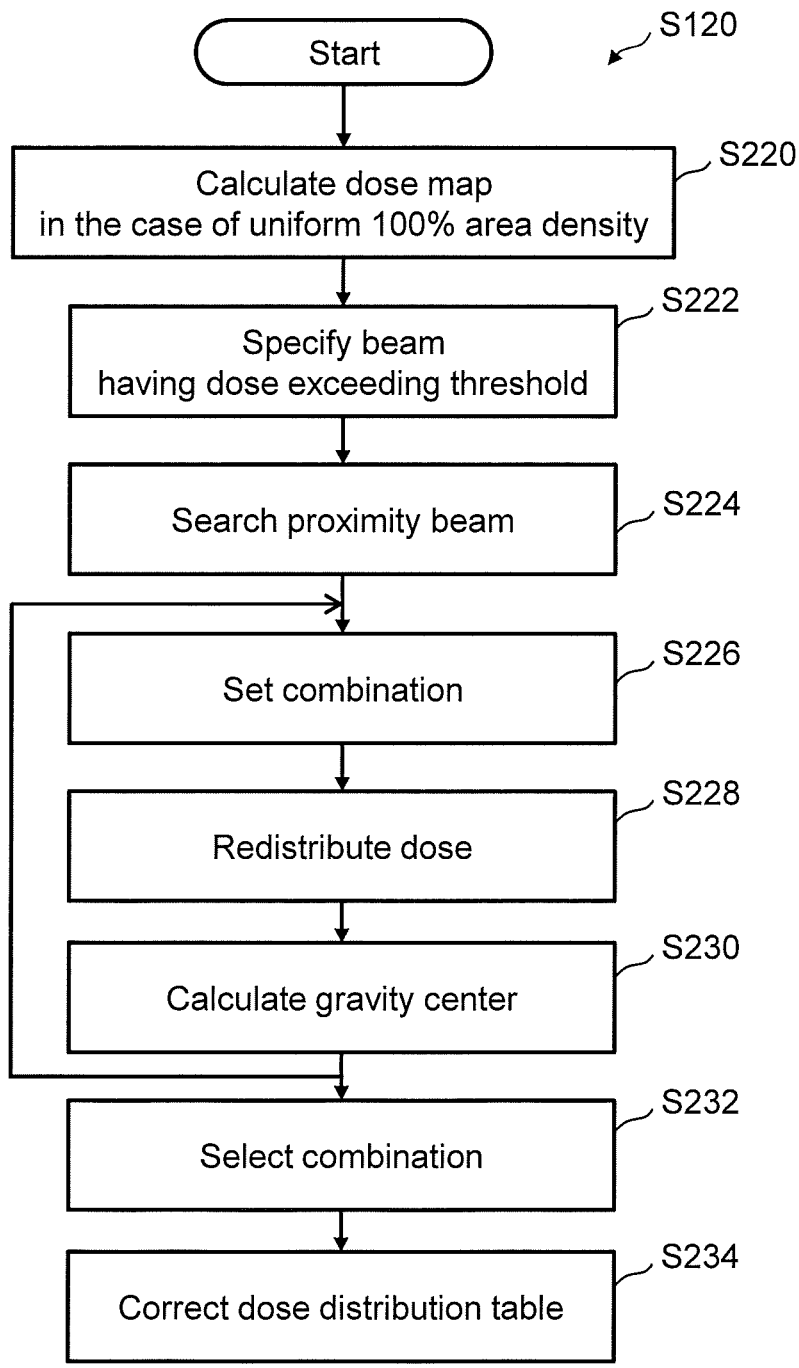
FIG. 19 is a flowchart showing steps in the dose distribution table adjustment step according to the second embodiment.

FIG. 19 is a flowchart showing internal steps in the dose distribution table adjustment step according to the second embodiment. In FIG. 19, the dose distribution table adjustment step (S120) executes a series of steps as its internal steps: a dose map generation step (S220), a beam specifying step (S222), a proximity beam search step (S224), a combination setting step (S226), a dose redistribution step (S228), a gravity center calculation step (S230), a combination selection step (S232), and a dose distribution table correction step (S234).

In the dose map generation step (S220), using the generated dose distribution table, when the incident dose D in the case of the area density of uniformly 100% is defined in all the control grids 27 of the stripe region 32 to be written, the dose map generation unit 90 distributes a distribution dose, obtained by multiplying the incident dose D for the control grid 27 concerned by a calculated distribution coefficient $w_k$ of each of four beams serving as destinations of distribution, to each control grid 27 where irradiation positions in design of the four beams are respective destinations of the distribution. Then, the dose map generation unit 90 corrects the incident dose D for each control grid 27 in the dose map by performing an adjustment by the distribution described above, and generates an modulated dose map (3) after correction. The incident dose D in the case of the area density of uniformly 100% may also be a standardized value "1", for example. In such a case, the dose of each control grid 27 after the adjustment is the total of distribution coefficients $w_k$ distributed from the surrounding control grids 27. The generated dose map (3) is stored in the storage device 142, for example.

In the beam specifying step (S222), the specifying unit 73 reads the dose map (3) from the storage device 142, and specifies a beam whose amount of distributed dose exceeds a pre-set threshold.

Figure 20:
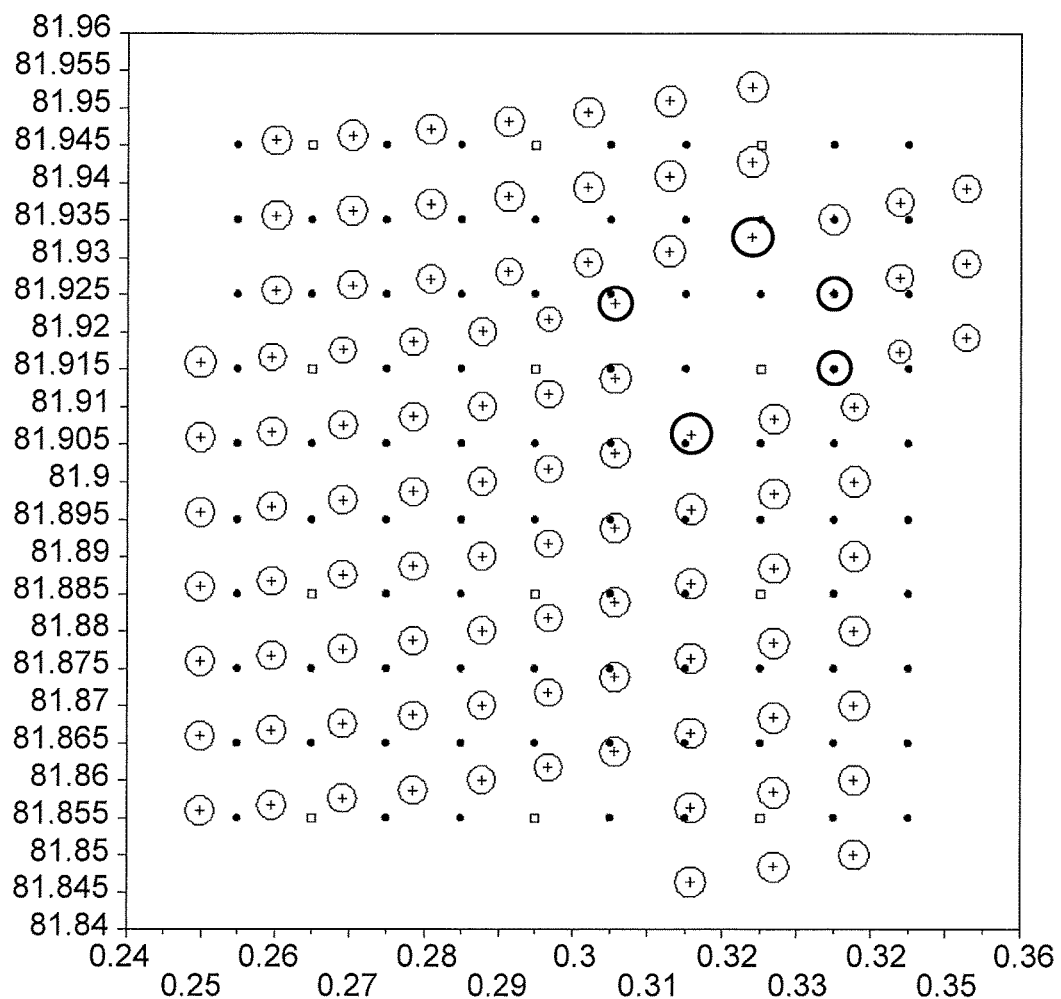
FIG. 20 shows an example of a dose map in the case of assuming the area density of uniformly 100% according to the second embodiment.

FIG. 20 shows an example of a dose map in the case of assuming the area density of uniformly 100% according to the second embodiment. FIG. 20 shows 10×10 control grids (black spots), and actual irradiation positions (cross marks) of 10×10 beams irradiating the 10×10 control grids, for example. The difference in the size of circles at the actual irradiation positions (cross marks) indicates a difference in the amount of doses. In the example of FIG. 20, a larger circle indicates a larger dose amount. As shown in the case of FIG. 20, it turns out that, depending on the amount of beam positional deviation, there are beams of a large amount of dose and a small amount of dose after dose distribution. Therefore, it turns out that there is still more room to reduce the adjustment width of dose modulation as long as making the correction effect for a positional deviation amount be somewhat sacrificed.

In the proximity beam search step (S224), with respect to specified beams each of whose distributed dose amount d exceeds a threshold Th', the search unit 74 searches for a plurality of proximity beams close to the periphery of the beam concerned, for each specified beam.

Figures 21, 22:
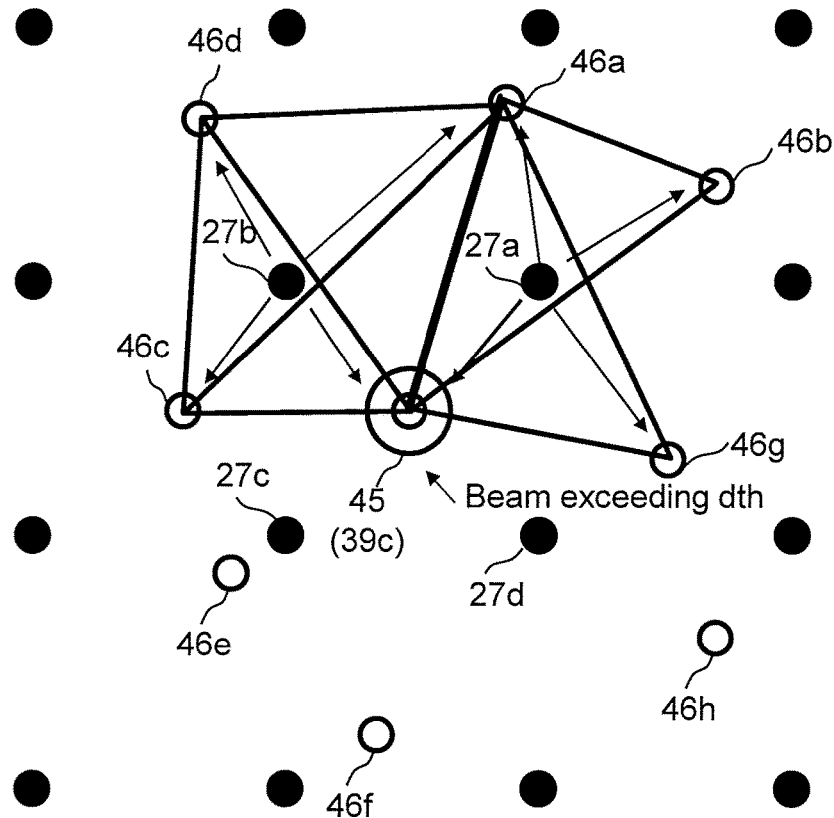
FIG. 21 illustrates a method of searching for a proximity beam close to a specific beam whose distributed dose amount exceeds a threshold according to the second embodiment.
FIG. 22 shows an example of a dose distribution table after correction according to the second embodiment.

FIG. 21 illustrates a method of searching for a proximity beam close to a specific beam whose distributed dose amount exceeds a threshold according to the second embodiment. The search unit 74 searches for and selects beams corresponding to a plurality of irradiation positions which receive dose distribution from four control grids 27a to 27d surrounding the irradiation position (here, irradiation position 39c) of the specific beam 45 concerned. Specifically, with respect to the four control grids 27a to 27d surrounding the irradiation position (here, irradiation position 39c) of the specific beam 45 concerned, the search unit 74 reads a generated dose distribution table from the storage device 142 for each of the control grids 27a to 27d, and searches for and selects beams corresponding to, for example, four irradiation positions to which a dose is distributed from the control grid 27 concerned. By this operation, in the example of FIG. 21, the search unit 74 specifies beams 46a, 46b, and 46g, in addition to the specific beam 45 concerned, to which a dose will be distributed from the control grid 27a. Moreover, the search unit 74 specifies beams 46a, 46d, and 46c, in addition to the specific beam 45 concerned, to which a dose will be distributed from the control grid 27b. Moreover, the search unit 74 specifies beams 46c, 46e, and 46f, in addition to the specific beam 45 concerned, to which a dose will be distributed from the control grid 27c. Moreover, the search unit 74 specifies beams 46f, 46h, and 46g, in addition to the specific beam 45 concerned, to which a dose will be distributed from the control grid 27d. As described above, the search unit 74 specifies and selects, for example, eight beams 46a to 46h around the specific beam 45 concerned. In many cases, a plurality of specified beams other than the specific beam 45 concerned are overlappingly selected with respect to each of the control grids 27a to 27d. By using a generated dose distribution table, the search unit 74 can easily specify, for example, the eight beams 46a to 46h around the specific beam 45 concerned.

Now, in the case of redistributing a dose exceeding the threshold, the following method can be used as a simple method. By using generated dose distribution tables for four control grid 27a to 27d in which the specific beam 45 concerned is defined as a distribution destination, any one of the four control grids 27a to 27d is selected. Then, with respect to four beams defined as distribution destinations of the selected control grid 27, redistribution is performed to the remaining beams other than the specific beam 45 concerned. Specifically, it operates as described below.

In the combination setting step (S226), the setting unit 75 sets a plurality of combinations each of which is composed of the specific beam 45 concerned and the remaining three beams defined in the generated dose distribution table for each of the control grids 27a to 27d. In other words, the combination is set for each dose distribution table.

In the dose redistribution step (S228), first, the writing control unit 72 calculates, for each specified beam, a difference dose d' for redistribution by subtracting a threshold dth from a distribution dose d of the specific beam 45 concerned. Since the distribution dose d (the total of doses distributed from surrounding control grids 27) of the specific beam 45 concerned and the distribution dose d (the total of doses distributed from surrounding control grids 27) of each of the surrounding eight beams 46a to 46h, for example, have already been calculated in the dose map generation step (S220), these values can be used in the present step. Next, for each combination, until the difference dose d' becomes zero, the redistribution unit 76 assigns a portion of the difference dose d', as a redistribution dose, to each of three beams other than the specific beam 45 concerned in four beams of the combination concerned in the order of distribution dose amount from smallest to largest until reaching respective thresholds dth. Alternatively, it is also preferable that the redistribution unit 76 assigns, for each combination, a dose equivalent to redistribution dose d'/J, obtained by dividing the difference dose d' by J being the number of beams (in this case, three) other than the specific beam 45 concerned for the combination concerned, uniformly to each of the J beams.

In the gravity center calculation step (S230), the gravity center calculation unit 77 calculates, for each combination, the position of the gravity center of each distribution dose of four beams, for example, defined in the dose distribution table after redistribution to each beam.

In the combination selection step (S232), the selection unit 78 (redistribution beam selection unit) selects, as a plurality of proximity beams serving as redistribution destinations, a proximity beam combination with respect to which deviation of the position of the gravity center due to redistribution is least, from a plurality of combinations. Specifically, it operates as described below. The selection unit 78 selects a combination with respect to which the position of the gravity center of each distribution dose after redistribution deviates least from the control grid 27 corresponding to the combination concerned. In many cases, there are four dose distribution tables defining the specific beam 45 concerned as a distribution destination. Therefore, in the combination selection step (S232), a dose distribution table with respect to which the gravity center deviates least in the case of dose redistribution is selected from the four dose distribution tables.

In the dose distribution table correction step (S234), the correction unit 79 corrects the distribution coefficient $w_k$ of each of four beams defined in the dose distribution table of a selected combination.

FIG. 22 shows an example of a dose distribution table after correction according to the second embodiment. In FIG. 22, for each target grid (control grid 27) (black) of the coordinates (i, j) corresponding to a selected combination, the distribution coefficient $w_k$ for each of four beams of identification coordinates ($i_k$, $j_k$) being a distribution destination is corrected to a distribution coefficient $w_k'$. Specifically, a coefficient Δ for the dose to be redistributed is added to the distribution coefficient $w_k$ of each of three beams which receive redistribution, for example. The distribution coefficient of the specific beam whose distributed dose amount exceeds a threshold is corrected by multiplying by a value, as a coefficient, obtained by dividing the threshold dth by a distribution dose d of the specific beam 45 exceeding the threshold. This corrects the dose distribution table of the selected combination.

Alternatively, as a modified example, it is also preferable to perform dose redistribution regardless of combination of each dose distribution table. In that case, it operates as described below.

In the combination setting step (S226), the setting unit 75 sets a plurality of combinations each composed of pre-set J beams out of searched m proximity beams. In the example of FIG. 21, since the eight proximity beams 46a to 46h around the specific beam 45 concerned have already been searched, a plurality of combinations each composed of, for example, five proximity beams are randomly set out of the eight proximity beams 46a to 46h. It is preferable to acquire a plurality of combinations by selecting J proximity beams from the m proximity beams by a round robin method.

In the dose redistribution step (S228), first, the writing control unit 72 calculates, for each specified beam, a difference dose d' for redistribution by subtracting the threshold dth from a distribution dose d of the specific beam 45 concerned. Since the distribution dose d (the total of doses distributed from surrounding control grids 27) of the specific beam 45 concerned and the distribution dose d (the total of doses distributed from surrounding control grids 27) of each of the surrounding eight proximity beams 46a to 46h, for example, have already been calculated in the dose map generation step (S220), these values can be used in the present step. Next, for each combination, until the difference dose d' becomes zero, the redistribution unit 76 assigns a portion of the difference dose d', as a redistribution dose, in the order of distribution dose amount from smallest to largest with respect to J proximity beams of the combination concerned until reaching respective thresholds dth.

Alternatively, it is also preferable that the redistribution unit 76 uniformly assigns, for each combination, a dose equivalent to redistribution dose d'/J, obtained by dividing the difference dose d' by J being the number of beams, to each of the J proximity beams of the combination concerned. Here, since J being the number of beams configuring a combination can be set arbitrarily, generation of redistribution remnants of the difference dose d' can be substantially avoided.

In the gravity center calculation step (S230), the gravity center calculation unit 77 calculates, for each combination, the position of the gravity center of a dose to be redistributed to each proximity beam.

In the combination selection step (S232), the selection unit 78 (redistribution beam selection unit) selects, as a plurality of proximity beams serving as redistribution destinations, a proximity beam combination with respect to which deviation of the position of the gravity center due to redistribution is least, from a plurality of combinations. Specifically, it operates as described below. The selection unit 78 selects, as a J (plural) proximity beams serving as redistribution destinations, a proximity beam combination (composed of J beams) with respect to which the position of the gravity center of each redistribution dose (a portion of distribution dose of a specific beam whose distribution dose exceeds a threshold) to be redistributed deviates least from the irradiation position (e.g., irradiation position 39c) of the specific beam 45 concerned.

In the dose distribution table correction step (S234), for each beam of a selected proximity beam combination (composed of J beams), the correction unit 79 reads a plurality of dose distribution tables in which the beam concerned is defined as a distribution destination, and performs correction such that a redistribution coefficient Δ obtained by dividing a coefficient equivalent to a redistribution dose to be redistributed by the number of distribution destinations is added to the original distribution coefficient defined in each dose distribution table. For example, if the coefficient equivalent to a redistribution dose to be redistributed to one of selected proximity beam combinations is 0.4, and the number of dose distribution tables of a distribution destination is four, 0.1 should be added to each corresponding dose distribution table.

Moreover, with respect to a distribution coefficient of a specific beam whose distribution dose exceeds a threshold, the correction unit 79 reads a dose distribution table defining a selected proximity beam combination (composed of J beams), and then, the distribution coefficient of the specific beam in each dose distribution table is multiplied by a value, as a coefficient, obtained by dividing the threshold dth by a distribution dose d of the specific beam 45 exceeding the threshold. This corrects each dose distribution table relevant to a selected proximity beam combination.

The contents of each step after the dose map correction step (S130) per stripe are the same as those of the first embodiment.

According to the second embodiment, since redistribution is performed while shifting the position of the center of gravity for a portion of the dose which has originally been distributed with consideration for not changing the position of the center of gravity, positional deviation can be as small as possible even though it occurs a little.

According to the second embodiment, the adjustment width of dose modulation can be reduced much more than that of the first embodiment, thereby further improving the throughput.

Third Embodiment

In the above second embodiment, the case has been described where a dose distribution table is corrected before adjusting a dose corresponding to an actual writing pattern, but the method of reducing the adjustment width of dose modulation is not limited thereto. In a third embodiment, there will be described a method of further reducing the adjustment width of dose modulation after modulating the dose corresponding to an actual writing pattern by using a dose distribution table.

Figure 23:
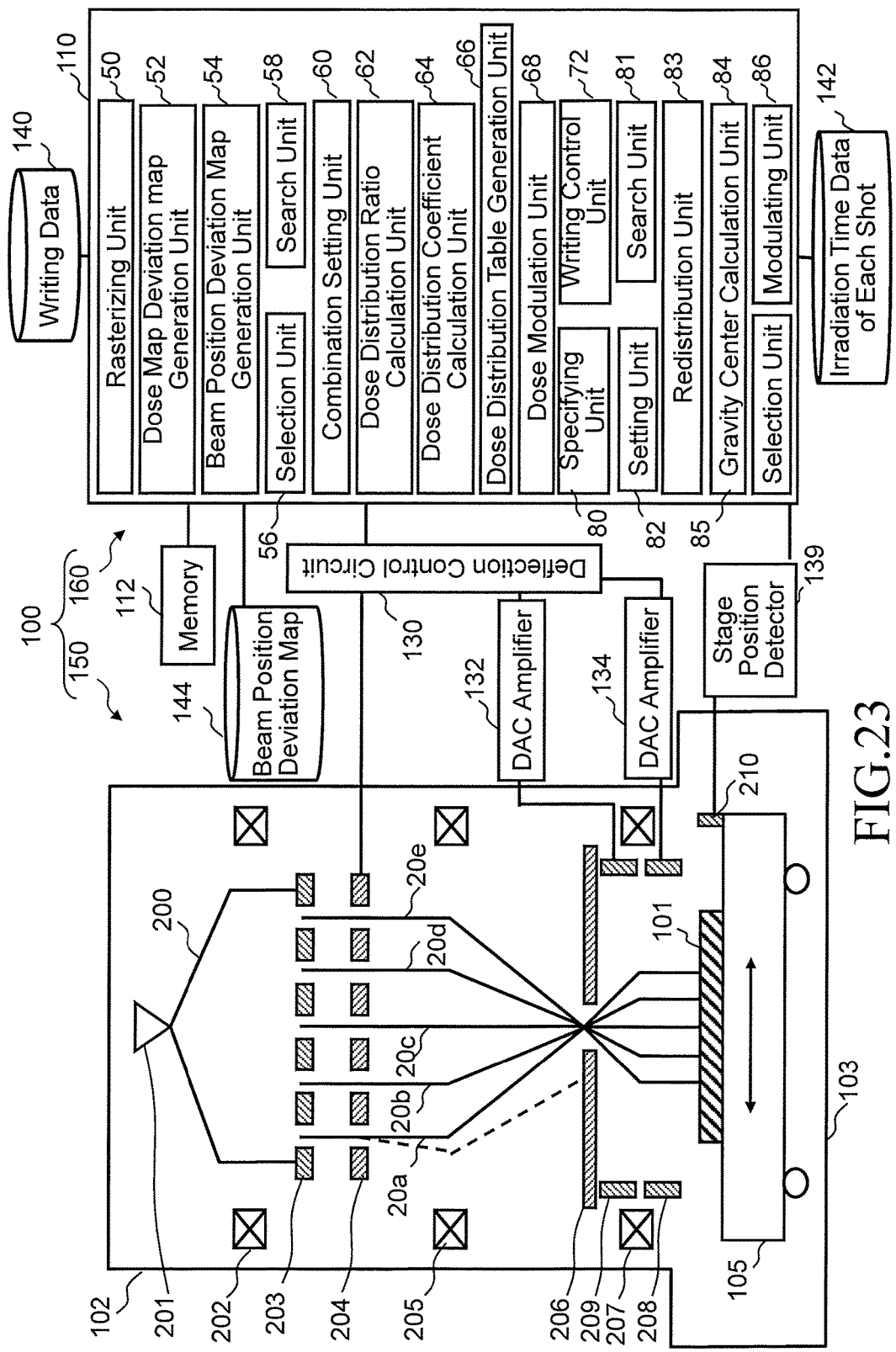
FIG. 23 is a conceptual diagram showing a configuration of a writing apparatus according to a third embodiment.

FIG. 23 is a conceptual diagram showing a configuration of a writing apparatus according to the third embodiment. FIG. 23 is the same as FIG. 1 except that, in the control computer 110, a specifying unit 80, a search unit 81, a setting unit 82, a redistribution unit 83, a gravity center calculation unit 84, a selection unit 85, and a modulating unit 86 are further arranged. Therefore, each of " . . . units" such as the rasterizing unit 50, the dose map generation unit 52, the beam-positional-deviation map generation unit 54, the selection unit 56, the search unit 58, the combination setting unit 60, the dose distribution ratio calculation unit 62, the dose distribution coefficient calculation unit 64, the dose distribution table generation unit 66, the dose modulation unit 68, the writing control unit 72, the specifying unit 80, the search unit 81, the setting unit 82, the redistribution unit 83, the gravity center calculation unit 84, the selection unit 85, and the modulating unit 86 includes a processing circuitry. As the processing circuitry, for example, an electric circuit, computer, processor, circuit board, quantum circuit, or semiconductor device is used. Each " . . . unit" may use a common processing circuitry (same processing circuitry), or different processing circuitries (separate processing circuitries). Information input and output to/from each of the above-described units, and information being operated are stored in the memory 112 each time.

Figure 24:
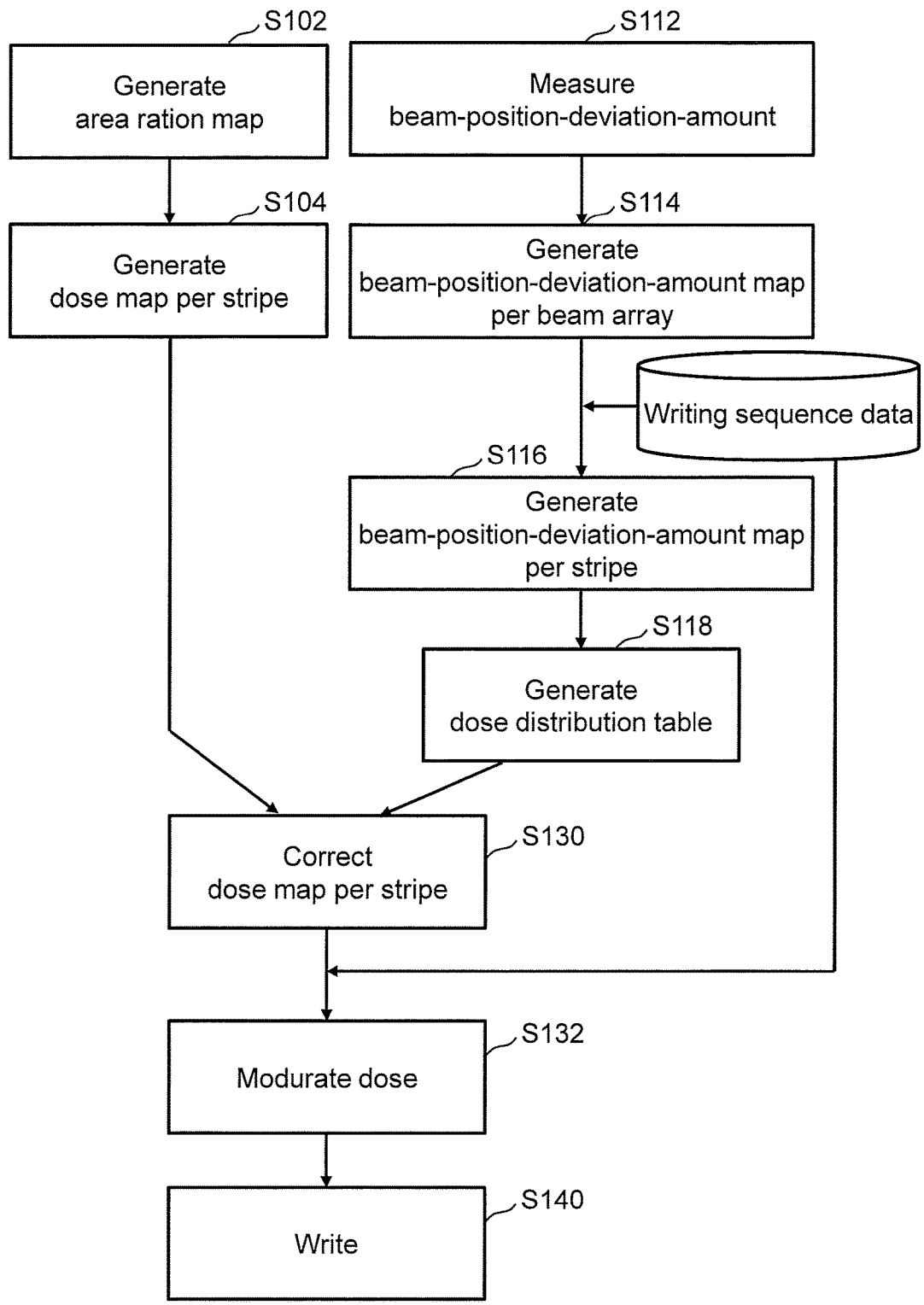
FIG. 24 is a flowchart showing main steps of a writing method according to the third embodiment.

FIG. 24 is a flowchart showing main steps of a writing method according to the third embodiment. FIG. 24 is the same as FIG. 9 except that a dose modulation step (S132) is added between the dose map correction step (S130) per stripe and the writing step (S140). The contents of the third embodiment are the same as those of the first embodiment except for what is specifically described below.

The contents of each of the area ratio map generation step (S102), the dose map generation step (S104) per stripe, the beam-positional-deviation-amount measurement step (S112), the beam-positional-deviation-amount map generation step (S114) per beam array, the beam-positional-deviation-amount map generation step (S116) per stripe, the dose distribution table generation step (S118) and the dose map correction step (S130) are the same as those of the first embodiment.

In the dose modulation step (S132), a generated dose map (2) is adjusted in order to correct a part of the dose distribution method. Specifically, it operates as described below.

The specifying unit 80 reads a dose map (2) from the storage device 142, and specifies a beam (control grid 27) whose incident dose D (dose amount) exceeds a pre-set threshold Dth.

Next, for each specified beam whose incident dose D (dose amount) exceeds the threshold Dth, the search unit 81 searches for a plurality of proximity beams close to the periphery of the beam concerned. Specifically, it operates as described below. The search unit 81 searches for a plurality of proximity beams around the specific beam 45 whose actual irradiation position (e.g., irradiation position 39c) is the control grid 27 whose incident dose D (dose amount) exceeds the threshold Dth. According to the third embodiment, similarly to the second embodiment, the search unit 81 searches for and selects beams corresponding to a plurality of irradiation positions which receive dose distribution from four control grids 27a to 27d surrounding the irradiation position (here, irradiation position 39c) of the specific beam 45 concerned. According to the third embodiment, similarly to the second embodiment, the search unit 81 can easily specify, for example, eight beams 46a to 46h around the specific beam 45 concerned by using a generated dose distribution table.

The setting unit 82 sets a plurality of combinations each composed of pre-set J beams out of searched m proximity beams. In the example of FIG. 21, since the eight proximity beams 46a to 46h around the specific beam 45 concerned have already been searched, a plurality of combinations each composed of, for example, five proximity beams are randomly set out of the eight proximity beams 46a to 46h. It is preferable to acquire a plurality of combinations by selecting J proximity beams from the m proximity beams by a round robin method.

Next, the writing control unit 72 calculates, for each specified beam, a difference dose D' for redistribution by subtracting a threshold Dth from an incident dose D of the control grid 27 corresponding to the specific beam 45 concerned. The incident dose D of the control grid 27 corresponding to the specific beam 45 concerned, and the incident dose D of each of the eight control grids 27 corresponding to, for example, peripheral eight proximity beams 46a to 46h can be referred to from the dose map (2).

Next, for each combination, until the difference dose D' becomes zero, the redistribution unit 83 assigns a portion of the difference dose D', as a redistribution dose, from smallest to largest in the order of incident dose D of J control grids 27 corresponding to J proximity beams of the combination concerned until reaching respective thresholds Dth. Alternatively, it is also preferable that the redistribution unit 83 uniformly assigns, for each combination, a dose equivalent to redistribution dose D'/J, obtained by dividing the difference dose D' by J being the number of beams, to each of the control grids 27 corresponding to the J proximity beams of the combination concerned. Here, since J being the number of beams configuring a combination can be set arbitrarily, generation of redistribution remnants of the difference dose D' can be substantially avoided.

The gravity center calculation unit 84 calculates, for each combination, the position of the gravity center of a dose to be redistributed to each proximity beam.

Next, the selection unit 85 (redistribution beam selection unit) selects, as a plurality of proximity beams serving as redistribution destinations, a proximity beam combination with respect to which deviation of the position of the gravity center due to redistribution is least, from a plurality of combinations. Specifically, it operates as described below. The selection unit 85 selects, as a J (plural) proximity beams serving as redistribution destinations, a proximity beam combination (composed of J beams) with respect to which the position of the gravity center of each redistribution dose to be redistributed deviates least from the irradiation position (e.g., irradiation position 39c) of the specific beam 45 concerned.

The modulating unit 86 performs dose modulation, for each proximity beam of the selected proximity beam combination (composed of J beams), by adding each distribution dose to the incident dose D of the control grid 27 corresponding to the proximity beam concerned. Similarly, the incident dose D of the control grid 27 corresponding to the specific beam whose incident dose D exceeds the threshold Dth is modulated to be the threshold Dth.

By the process described above, it is possible to eliminate the control grid 27 whose incident dose D exceeds the threshold Dth. The contents of the writing step (S140) are the same as those of the first embodiment.

Figure 25A:
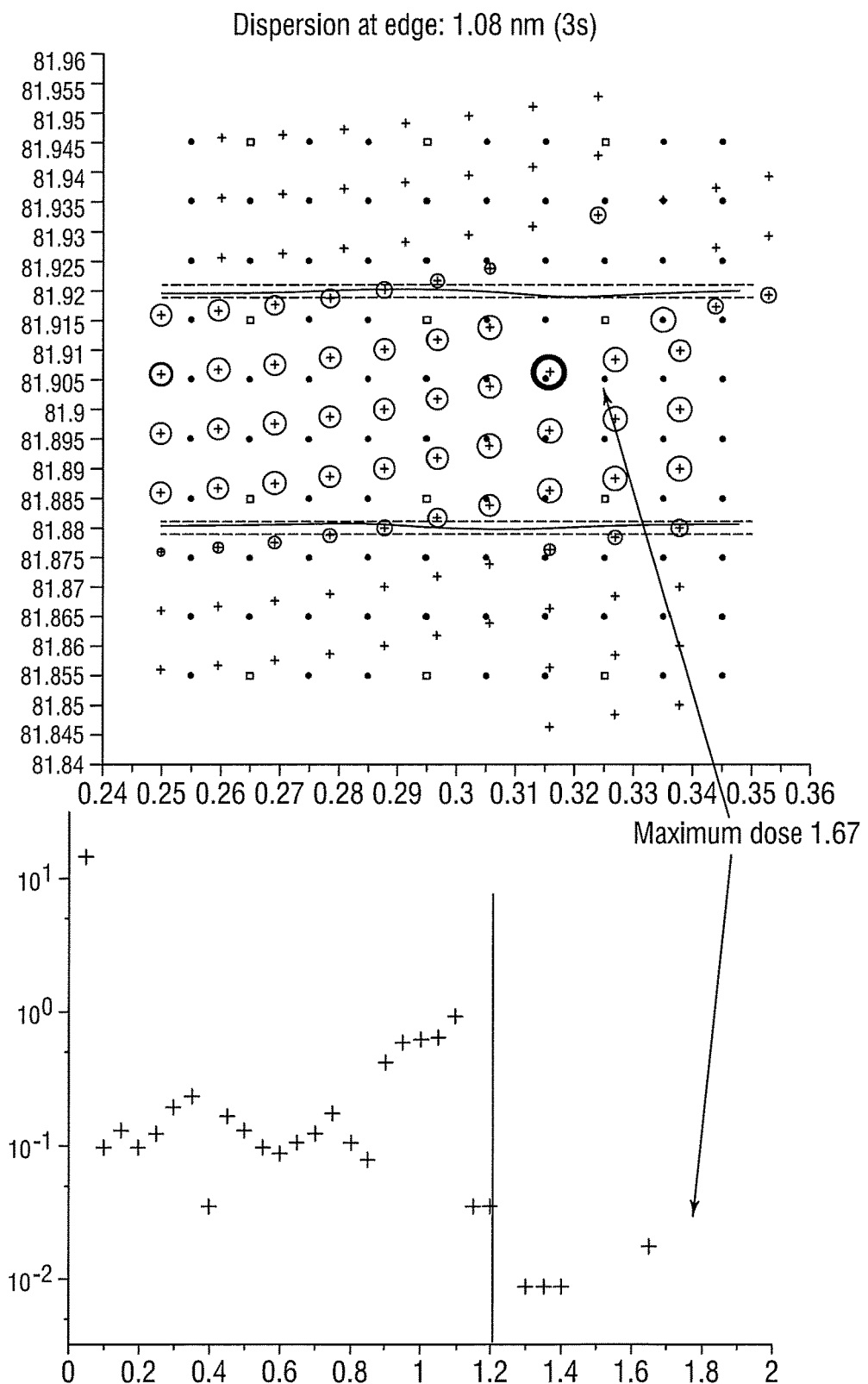
FIGS. 25A and 25B show examples of dispersion at the edge due to dose distribution and a dose frequency according to the third embodiment.
Figure 25B:
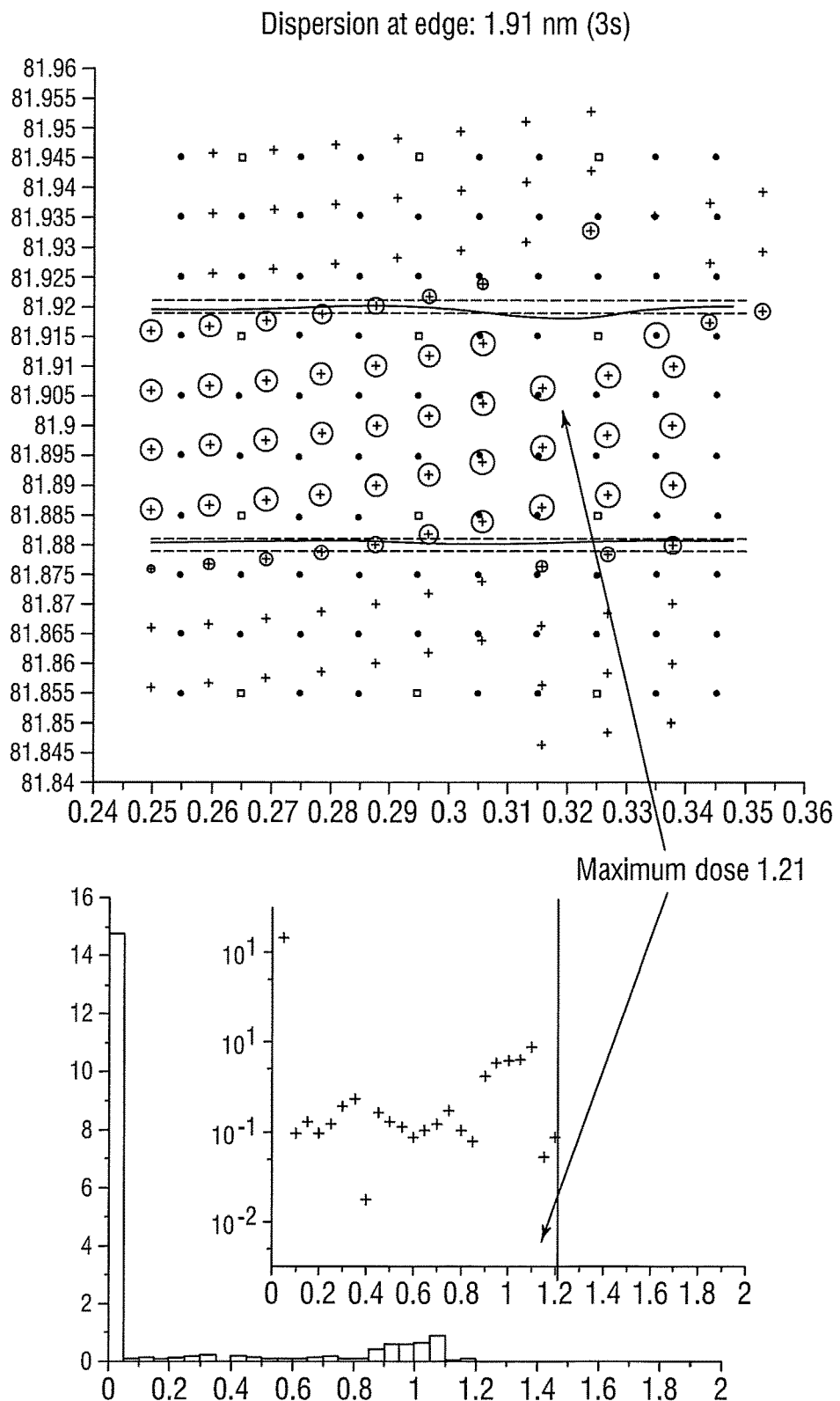

FIGS. 25A and 25B show examples of dispersion at the edge due to dose distribution and a dose frequency according to the third embodiment. FIG. 25A shows a comparative example in the case where dispersion at the edge can be reduced to 1.08 nm (3σ) and the maximum dose can be reduced to 1.67 by the configuration for performing distribution to four points according to the first embodiment. This comparative example shows the case of writing a pattern different from that of the example shown in FIGS. 16A and 16B. In that case, although the value of dispersion of 3σ at the edge deteriorates to 1.91 nm due to dose modulation performed in the third embodiment as shown in FIG. 25B, it turns out that the maximum dose has been decreased to 1.21.

According to the third embodiment, since redistribution is performed while shifting the position of the center of gravity for a portion of the dose which has originally been distributed with consideration for not changing the position of the center of gravity, positional deviation can be as small as possible even though it occurs a little.

According to the third embodiment, the adjustment width of dose modulation can be reduced much more than that of the first embodiment, thereby further improving the throughput.

Embodiments have been explained referring to specific examples described above. However, the present invention is not limited to these specific examples. For example, although, in the above-described example, deviation of the position of the gravity center is calculated when selecting a combination to be redistributed, it is not limited thereto. It is also preferable to select a combination with respect to which the sum total of a value obtained by multiplying a squared distance from the target reference position (e.g., position of control grid) by a dose after redistribution is smallest.

While the case of inputting a 10-bit control signal into each control circuit 41 has been described above, the number of bits may be suitably set. For example, a 2-bit (or 3 to 9 bit) control signal may be used. Alternatively, a control signal of 11-bits or more may be used.

While the apparatus configuration, control method, and the like not directly necessary for explaining the present invention are not described, some or all of them can be selectively used case-by-case basis. For example, although description of the configuration of the control circuit for controlling the writing apparatus 100 is omitted, it should be understood that some or all of the configuration of the control circuit can be selected and used appropriately when necessary.

In addition, any other multiple charged particle beam writing apparatus and multiple charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple charged particle beam writing apparatus comprising:
    an emission source configured to emit a charged particle beam;
    a shaping aperture array substrate configured to form multiple charged particle beams by being irradiated with the charged particle beam;
    a combination setting circuitry configured to set, for each of a plurality of design grids being irradiation positions in design of the multiple charged particle beams, a plurality of combinations each composed of three beams whose actual irradiation positions surround a design grid concerned in the plurality of design grids, by using four or more beams whose actual irradiation positions are close to the design grid concerned;
    a first distribution coefficient calculation circuitry configured to calculate, for each of the plurality of combinations, a first distribution coefficient for each of the three beams configuring a combination concerned in the plurality of combinations, for distributing a dose to irradiate the design grid concerned to the three beams configuring the combination concerned such that a position of a gravity center of each distributed dose coincides with a position of the design grid concerned and a sum of the each distributed dose coincides with the dose to irradiate the design grid concerned, where at least one the first distribution coefficient is calculated for the each of the four or more beams;
    a second distribution coefficient calculation circuitry configured to calculate, for each of the four or more beams, a second distribution coefficient of the each of the four or more beams relating to the design grid concerned by dividing a total value of the at least one the first distribution coefficient corresponding to a beam concerned in the four or more beams by a number of the plurality of combinations; and
    a writing mechanism configured to write a pattern on a target object with the multiple charged particle beams in which the dose to irradiate each of the plurality of design grids has been distributed to each corresponding one of the four or more beams.

2. The apparatus according to claim 1, wherein the dose to irradiate the each of the plurality of design grids is distributed to four beams whose actual irradiation positions are close to the design grid concerned, further comprising:
    a proximity beam selection circuitry configured to select, for the each of the plurality of design grids, as the four beams whose actual irradiation positions are close to the design grid concerned, a beam corresponding to a closest irradiation position in each of four regions obtained by being divided by two straight lines which pass the design grid concerned and have different angles.

3. The apparatus according to claim 1, further comprising:
    a redistribution circuitry configured to redistribute, with respect to a beam whose received distributed dose exceeds a threshold if the dose to irradiate the design grid concerned has been distributed, a portion of a distribution dose to be distributed to the beam, to a plurality of beams around the beam concerned.

4. The apparatus according to claim 3, further comprising:
    a redistribution beam selection circuitry configured to select, as the plurality of beams serving as redistribution destinations, a beam combination, with respect to which deviation of a position of a gravity center due to redistribution is least, from a plurality of combinations.

5. The apparatus according to claim 1, further comprising:
    a dose map generation processing circuitry configured to generate a dose map which defines an incident dose for the each of the plurality of design grids.

6. The apparatus according to claim 1, further comprising:
    a beam-positional-deviation map generation circuitry configured to generate a first beam-positional-deviation-amount map which defines a positional deviation amount of each beam of the multiple charged particle beams.

7. The apparatus according to claim 6, wherein the beam-positional-deviation map generation circuitry further generates a second beam-positional-deviation-amount map for the each of the plurality of design grids, using the first beam-positional-deviation-amount map.

8. The apparatus according to claim 7, wherein the actual irradiation positions are obtained using the second beam-positional-deviation-amount map.

9. The apparatus according to claim 1, further comprising:
a dose distribution table generation circuitry configured to generate a dose distribution table in which the second distribution coefficient for the each of the four or more beams is defined relating to a target design grid of the plurality of design grids.

10. A multiple charged particle beam writing method comprising:
setting, for each of a plurality of design grids being irradiation positions in design of multiple charged particle beams, a plurality of combinations each composed of three beams whose actual irradiation positions surround a design grid concerned in the plurality of design grids, by using four or more beams whose actual irradiation positions are close to the design grid concerned;
calculating, for each of the plurality of combinations, a first distribution coefficient for each of the three beams configuring a combination concerned in the plurality of combinations, for distributing a dose to irradiate the design grid concerned to the three beams configuring the combination concerned such that a position of a gravity center of each distributed dose coincides with a position of the design grid concerned and a sum of the each distributed dose coincides with the dose to irradiate the design grid concerned, where at least one the first distribution coefficient is calculated for the each of the four or more beams;
calculating, for each of the four or more beams, a second distribution coefficient of the each of the four or more beams relating to the design grid concerned by dividing a total value of the at least one the first distribution coefficient corresponding to a beam concerned in the four or more beams by a number of the plurality of combinations; and
writing a pattern on a target object with the multiple charged particle beams in which the dose to irradiate each of the plurality of design grids has been distributed to each corresponding one of the four or more beams.

* * * * *